United States Patent [19]

Ueda et al.

[11] Patent Number: 5,298,848
[45] Date of Patent: Mar. 29, 1994

[54] LARGE CAPACITY VARIABLE SPEED PWM SPATIAL VECTOR TYPE SUB-HARMONIC SYSTEM FOR DRIVING AC ELECTRIC MOTOR

[75] Inventors: Shigeta Ueda; Takashi Ikimi, both of Hitachi; Mitsuyuki Hombu, Katsuta; Noboru Ogawa, Hitachi; Yorito Jifuku, Hitachi; Kenzo Kamiyama, Hitachi, all of Japan

[73] Assignee: Hitachi, Ltd., Tokyo, Japan

[21] Appl. No.: 797,956

[22] Filed: Nov. 26, 1991

[30] Foreign Application Priority Data

Nov. 28, 1990 [JP] Japan ............... 2-323155

[51] Int. Cl.⁵ ............................... H02P 7/00
[52] U.S. Cl. .................... 318/811; 318/806; 318/801
[58] Field of Search ........ 318/254, 439, 138, 799–812; 363/71, 84, 85, 89, 37, 98, 135, 36

[56] References Cited

U.S. PATENT DOCUMENTS

| | | | |
|---|---|---|---|
| 3,609,511 | 9/1971 | Risberg | 363/135 |
| 3,700,987 | 10/1972 | Deering | 318/811 X |
| 3,800,211 | 3/1974 | Tracy | 318/811 |
| 3,823,362 | 7/1974 | Bailey | 363/36 X |
| 4,358,726 | 11/1982 | Iwakane et al. | 318/806 |
| 4,400,656 | 8/1983 | Duis | 318/806 X |
| 4,465,961 | 8/1984 | Landino | 318/811 |
| 4,549,258 | 10/1985 | Honbu et al. | 363/71 |
| 4,760,321 | 7/1988 | Tanaka et al. | 318/809 |
| 4,951,187 | 8/1990 | Stemmler | 363/71 X |
| 5,031,088 | 7/1991 | Tanaka | 363/71 |
| 5,065,303 | 11/1991 | Nguyen et al. | 363/71 X |
| 5,099,410 | 3/1992 | Divan | 363/98 |

FOREIGN PATENT DOCUMENTS 2-51363  2/1990  Japan.
3-36964  2/1991  Japan.
3-65045  3/1991  Japan.

*Primary Examiner*—Jonathan Wysocki
*Attorney, Agent, or Firm*—Antonelli, Terry, Stout & Kraus

[57] ABSTRACT

A large capacity (1-2 MkVA) driving system for variable-speed-driving an AC motor by a power converter (inverter, converter) in which GTO (gate turn-off) thyristors are used as switching devices. In this system, high frequency GTO thyristors are connected in series, power converters are multiplexed, the AC motor is used in its plural phases, instantaneous spatial vector PWM (pulse width modulation) control is performed, vector control for the motor is performed, and a circuit for recovering snubber energy for GTO thyristors and a power factor adjusting circuit are provided. Thus, this driving system provides a torque ripple of 1% or less, speed response of 60 rad/sec or more, efficiency of 95% or more and a power factor of 98% or more.

13 Claims, 25 Drawing Sheets

FIG. 9

| POWER CONVERTER SPECIFICATIONS: CONVERTER, INVERTER MULTI-PARALLEL CAPACITY 2700KVA(1350X2), DC VOLTAGE 4000V, SWITCHING 500Hz ||||
|---|---|---|---|
| SWITCHING LOSS | SNUBBER LOSS | INTERPHASE REACTOR AND OTHERS | EFFICIENCY |
| 30 % | 40 % | 30 % | 96.2 % |

{ 1 : POSITIVE SIDE ELEMENT "ON"
0 : NEGATIVE SIDE ELEMENT "ON"

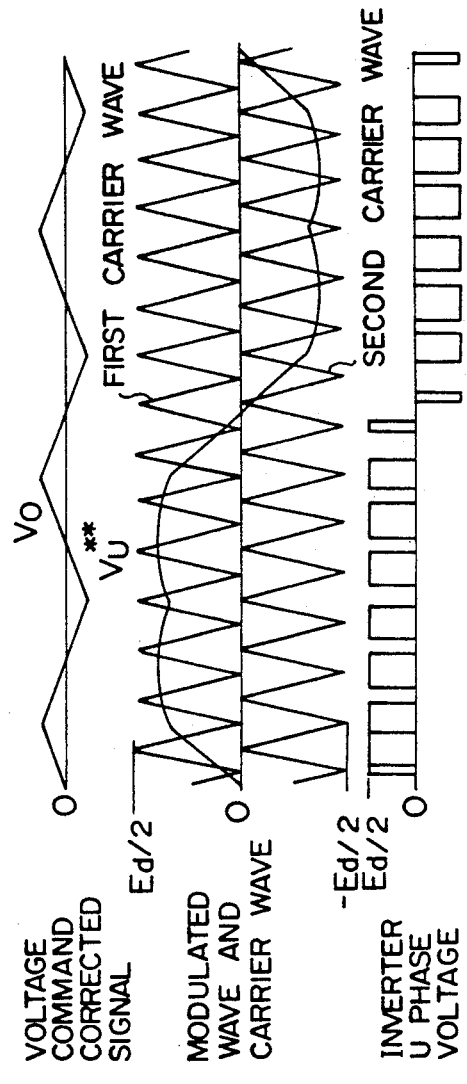
FIG. 14A VOLTAGE COMMAND
FIG. 14B VOLTAGE COMMAND CORRECTED SIGNAL
FIG. 14C MODULATED WAVE AND CARRIER WAVE
FIG. 14D INVERTER U PHASE VOLTAGE
FIG. 14E INVERTER V PHASE VOLTAGE
FIG. 14F LINE-TO-LINE VOLTAGE Vu-v

FIG. 15A
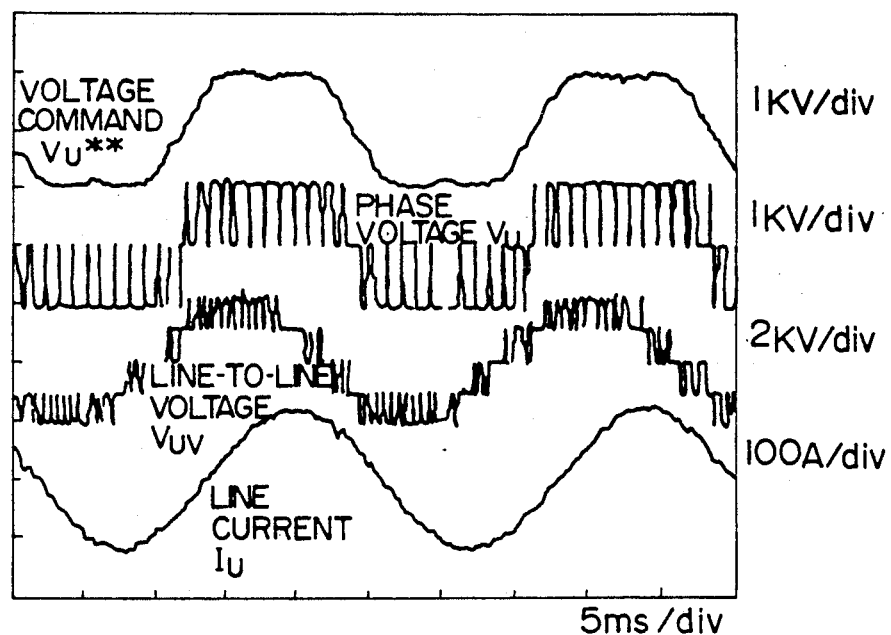
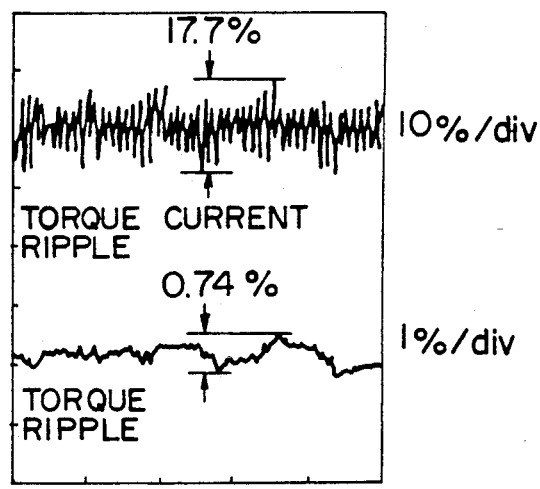

LARGE CAPACITY VARIABLE SPEED PWM SPATIAL VECTOR TYPE SUB-HARMONIC SYSTEM FOR DRIVING AC ELECTRIC MOTOR

BACKGROUND OF THE INVENTION

The present invention relates to a variable speed driving system for an AC electric motor, and more particularly to a large capacity variable speed driving system for driving an AC electric motor using a power converter device provided with a GTO (gate turn-off) thyristor.

A previously proposed variable speed driving system for an AC electric motor with the largest capacity using an inverter is a system with 4000 kVA for general industry such as a pump and a fan. An example of this system is disclosed in e.g. "Toshiba Review" Vol. 43, No. 3 (1983) page 253.

On the other hand, in the field of driving a roller of a rolling mill system, for example, that requires high response with a large capacity, an AC electric motor variable speed driving system based on a cycloconverter is adopted. Its examples are disclosed in Hitachi Hyoron Vol. 72, No. 5 (1990), pp. 441–446; Toshiba Review Vol. 43, No. 3 (1988), p. 256; and Mitsubishi Electric Technical Report Vol. 62, No. 6 (1988), pp. 501–506. An inverter in the field of large-capacity high speed -response such as one used to drive a roller, has not been published.

When conventional systems require a large capacity inverter, a GTO thyristor is used as a switching device in a main circuit of a high- voltage large current device. But, when the device capacity is increased, the permissible switching frequency of the device is reduced (the present limit is 100–150 Hz) so that even when a GTO thyristor is used, harmonics of the output wave from the inverter are increased, the torque ripple of a motor is increased, and loss in the snubber circuit for the GTO is increased (at the rate of square of the voltage).

On the other hand, in the case of the cycloconverter, the only convention device that can be applied to the field of large-capacity high response, the power factor in a power source is limited to around 0.6. In order to improve this power factor, a capacitor with a large capacitance for improving the power factor is required on the power source side. As a result, the resultant apparatus has a large scale.

SUMMARY OF THE INVENTION

An object of the present invention is to provide a large capacity variable speed driving system for an AC electric motor which can provide the torque ripple of 1% or less of the AC electric motor by an inverter having a capacity of 2000 kVA or more provided with GTO thyristors.

In order to attain the above object, a plurality of inverter units, each comprising a GTO thyristor with its permissible switching frequency of 500 Hz or more as switching devices in a main circuit, are connected in parallel in a multiplex manner, and a PWM (pulse width modulation) control device in an instantaneous spatial vector PWM control system or a spatial vector type SH (sub-harmonics) system controls the output from the inverter.

Since the plurality of inverter units each provided with GTO thyristor with its permissible switching frequency of 500 Hz or more are connected in parallel in a multiplex manner, assuming that the PWM switching frequency for each inverter unit is fs, the equivalent switching frequency viewed from a motor side is doubled to provide 2 fs, thereby realizing a high switching frequency. Thus, the inverter output voltage can be PWM-controlled precisely so that the harmonics of the inverter output current can be reduced thereby to decrease the torque ripple of the motor. Also, since the PWM control device in the instantaneous spatial vector system or the spatial vector type SH system selects the voltage vector along the magnetic flux circle of the electric motor to control the output voltage from the inverter, the torque ripple of the electric motor can be further reduced. By combining the components mentioned above, the torque ripple of 1% or less in the motor can be attained.

If the present invention is applied to driving a vehicle, because of high efficiency due to reduction of snubber loss, a cooling system can be miniaturized to reduce the weight of the vehicle body. Also, if the present invention is applied to AC driving for general industry. e.g., driving a pump and a fan because of high efficiency, the effect of reducing energy can be further improved.

In accordance with the present invention, since a plurality of inverter units each provided with a GTO thyristor with its permissible switching frequency of 500 Hz or more are connected in parallel in a multiplex manner, the equivalent switching frequency viewed from a motor side can be changed into a high switching frequency. Thus, the inverter output voltage can be PWM-controlled precisely so that the harmonics of the inverter output current can be reduced thereby to decrease the torque ripple of the motor. Also, since the PWM control device in the instantaneous spatial vector system or the spatial vector type SH system selects the voltage vector along the magnetic flux circle of the electric motor to control the output voltage from the inverter, the torque ripple of the electric motor can be further reduced. By combining the components mentioned above, a variable speed system for a large capacity AC motor which has a characteristic torque ripple of 1% or less in the motor can be provided.

The above and other objects and advantages of the present invention will be apparent from the following description taken in conjunction with the accompanying drawings

BRIEF DESCRIPTION OF THE DRAWINGS

FIG. 9 is a table showing the actual measurement results of the loss characteristic in a power converter according to the present invention;

FIGS. 14a-14f and 15a, 15b are waveform charts of the PWM control in the spatial vector type SH system;

DESCRIPTION OF THE PREFERRED EMBODIMENTS

Figure 1:
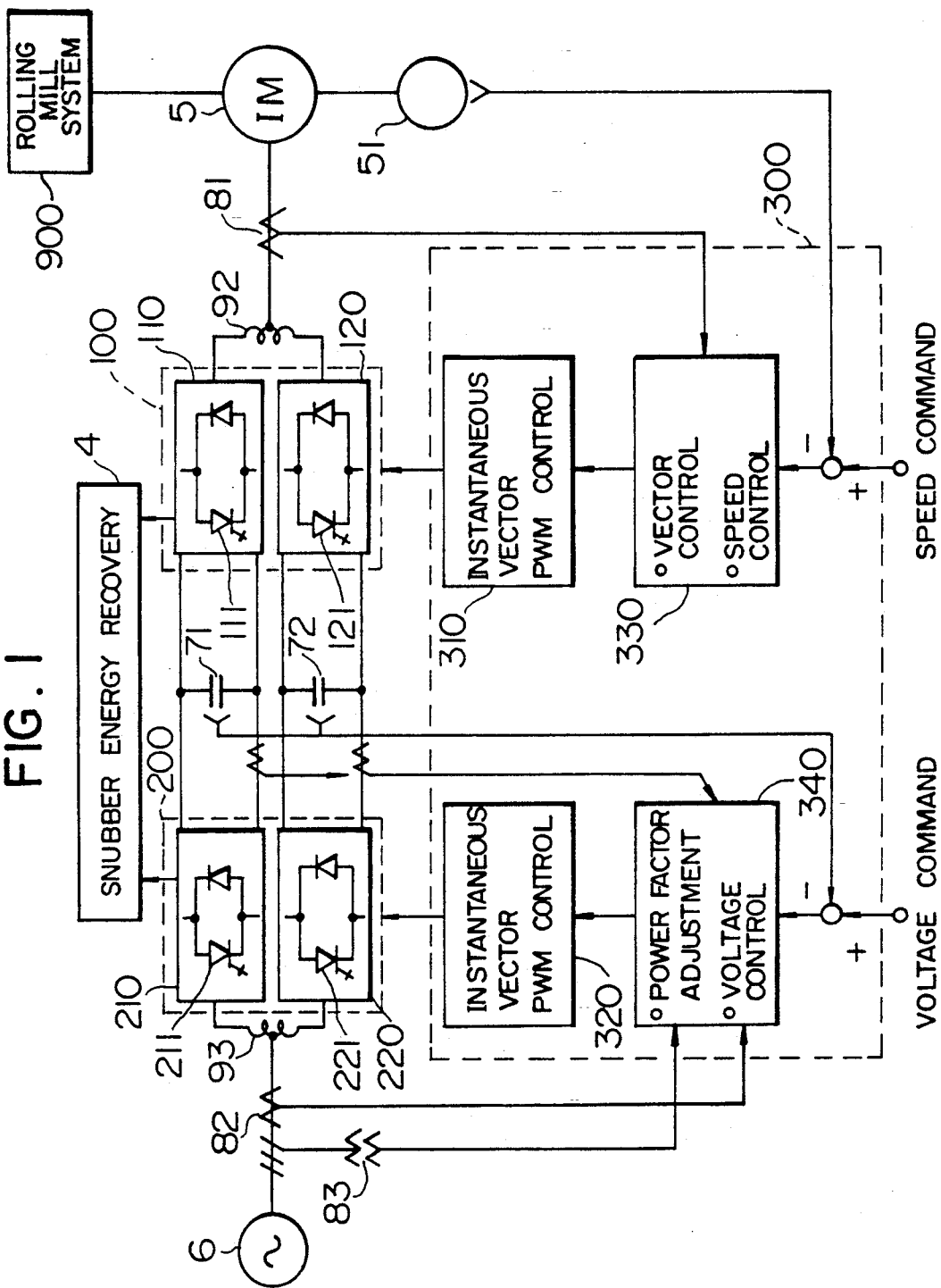
FIG. 1 is a view showing an arrangement of the large capacity AC electric motor variable speed system according to the first embodiment of the present invention.

Referring now to FIG. 1, an explanation will be given of the first embodiment of the large capacity AC electric motor variable speed system according to the present invention. In FIG. 1, an inverter 100 is composed of inverter units 110 and 120, and a converter 200 is composed of converter units 210 and 220. In the main circuit of each of these units, switching devices or elements 111, 121, 211 and 221 are large-capacity high-frequency GTO thyristors rated at the voltage of 4.5 kV, the current of 3 kA and the switching frequency of 500 Hz or more. Each inverter unit and each converter unit are connected through capacitors 71 and 72, respectively. The output terminals 110 and 120 of the inverter units are connected in parallel in a multiplex manner (hereinafter expressed as multi-connected in parallel or connected in multi-parallel) through an interphase reactor 92, and the middle point of the interphase reactor 92 is connected with an AC electric motor 5 for driving a driven system 900 which may include a roller of a rolling mill system, a pump, a fan, a vehicle, or a linear motor. The input terminals of the other converter units 210 and 220 are also multi-connected in parallel through another interphase reactor 93, and the middle point of interphase reactor 93 is connected with an AC power source 6. It should be now noted that the GTO thyristors constituting a main circuit of the above inverter and converter units are connected with a snubber circuit and a snubber energy recovering circuit 4 for recovering the electric energy stored in the snubber circuit to a DC power source on the side of the above capacitors. The inverter 100 and the converter 200 are controlled by a control circuit 300. Specifically, in the control circuit 300, the inverter 100 is controlled by a speed/vector control circuit 330 and an instantaneous spatial vector PWM control circuit 310, and the converter 200 is controlled by a power factor adjustment/voltage control circuit 340 and another instantaneous spatial vector PWM control circuit 320.

Figure 2:
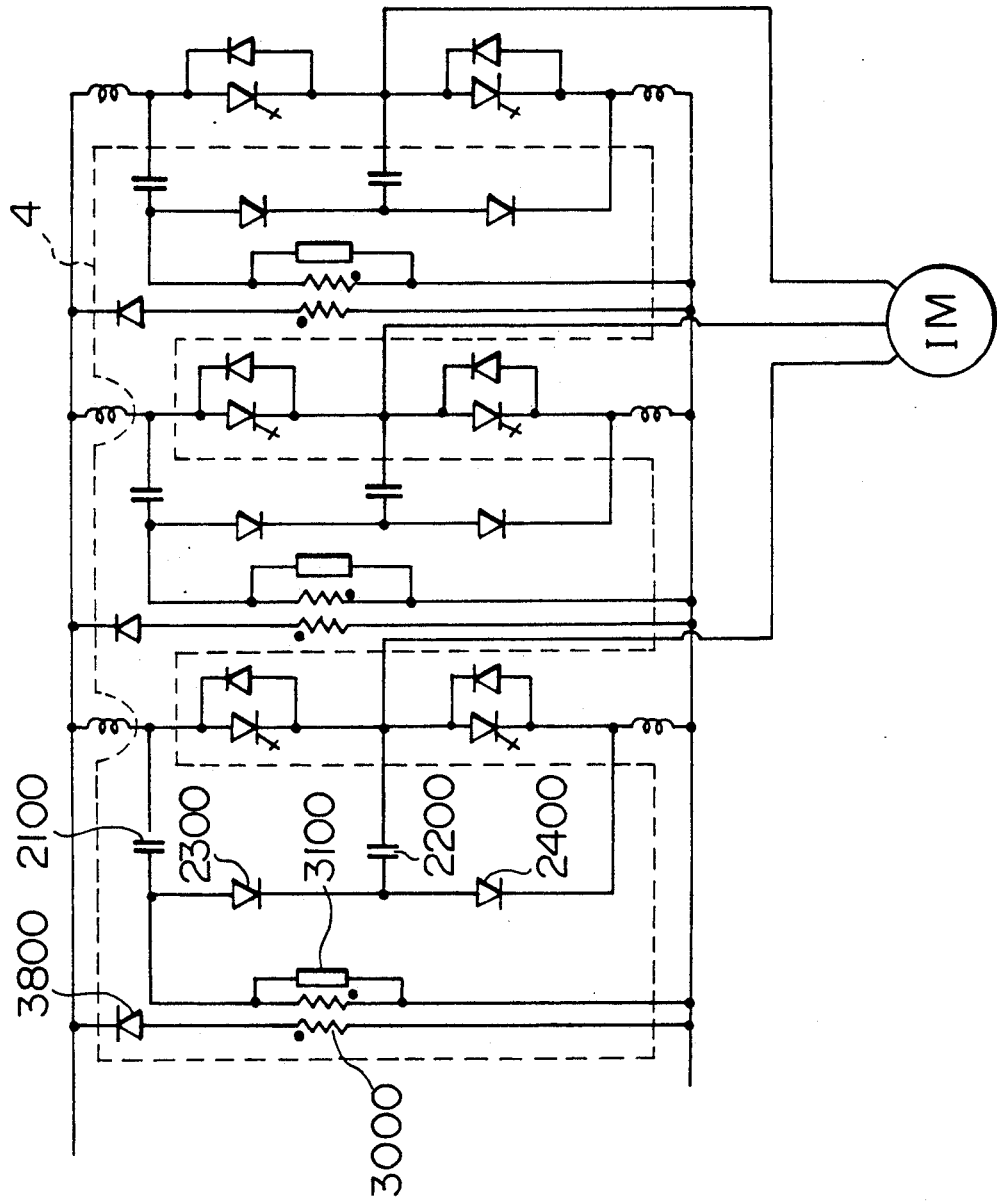
FIG. 2 is a view showing a detailed arrangement of the snubber circuit of the converter main circuit in FIG. 1.

A detailed explanation will be given of the components of the above system. The snubber energy recovering system 4 is constructed as shown in FIG. 2 for each inverter unit and for converter unit. A snubber circuit is composed of a first capacitor 2100, a second capacitor 2200 and two diodes 2300 and 2400 connected in series. The anode of the diode 2300 is connected with the positive terminal of a main switching circuit through the first capacitor 2100 and the cathode of the diode 2400 is connected with the negative terminal of the main switching circuit. The common junction of the diodes 2300 and 2400 connected in series is connected with a common junction of positive and negative arms through the second capacitor 2200.

A snubber recovering circuit is composed of a diode 3800, a transformer 3000 and a resistor 3100. The primary winding of the transformer 3000 is connected in parallel with the series connection of the diodes 2300 and 2400, and connected in parallel with a DC terminal through the first capacitor 2100 whereas the secondary winding of the transformer 3000 is connected with the DC terminal through the diode 3800 for preventing a current from flowing in a reverse direction. The resistor 3100 for reset is connected across the primary winding of the transformer 3000 so that part of the discharged current due to the snubber energy is bypassed to recover the snubber energy through the resistor 3100; thus, the excited current of the transformer 3000 is attenuated rapidly to prevent the magnetic saturation of an iron core. In this way, the current which flows continuously even when the snubber recovering energy is not being recovered can be reset rapidly by the resistor 3100 so that the magnetic saturation of the iron core can be prevented and thus the transformer can be miniaturized.

Referring to FIGS. 3A to 3F and 4A to 4F, the operation of recovering snubber energy will be explained below.

Figure 3A:
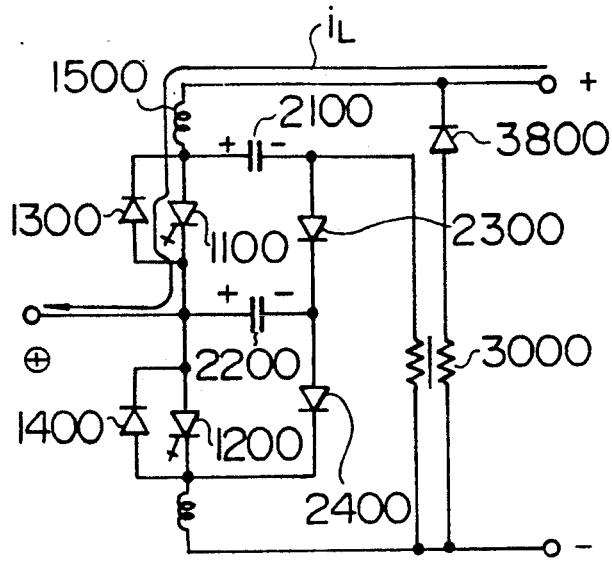
FIGS. 3A to 3F and 4A to 4F are views for explaining the operation of the snubber circuit shown in FIG. 2.
Figure 3B:
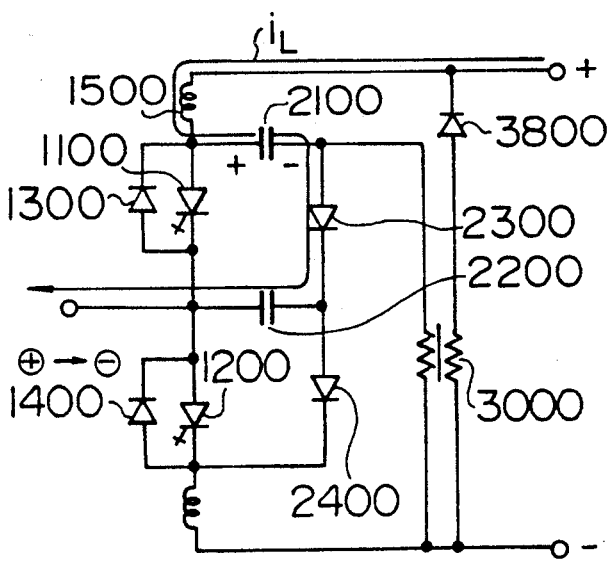

FIGS. 3A to 3F show the circuit operation in which the current flow state of a positive arm is returned to the same state via the current flow state of a negative arm. In the state of FIG. 3A, a GTO thyristor is 'on' and an current iL from is supplied to an AC terminal. In this state, if an off-gate signal is applied to the GTO thyristor 1100, the current iL having flowed until now flows along the path (capacitor 2100—diode 2300—capacitor 2200) as shown in FIG. 3B. Then, a switching surge is absorbed and the energy with the polarity as shown stored in the capacitor 2200 is discharged to the AC terminal. In the state is FIG. 3B, since the GTO thyristor 1100 is changed from 'on' to 'off', with the polarity of the current iL being positive (flowing-out direction) the polarity of the voltage at the AC terminal is changed from positive to negative; namely the state of FIG. 3B is equivalent to the state of delay power factor, i.e., delayed-phase driving state. On the other hand, the capacitor 2100 is excessively charged.

Figure 3C:
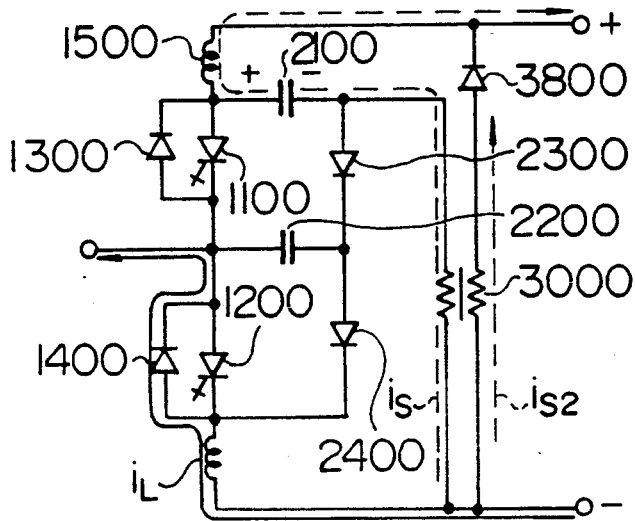

In the return mode as shown in FIG. 3C in which the current iL flows to the negative mode, the charge stored in the capacitor 2100 are discharged along the passage shown in dotted line so that a discharged current is flows towards the primary winding of the transformer 3000. Thus, the current $i_{s2}$ that is inversely proportional to the number of the primary and secondary windings flows to the secondary winding side of the transformer 3000 so that the energy is recovered to the DC power source side.

Figure 3D:
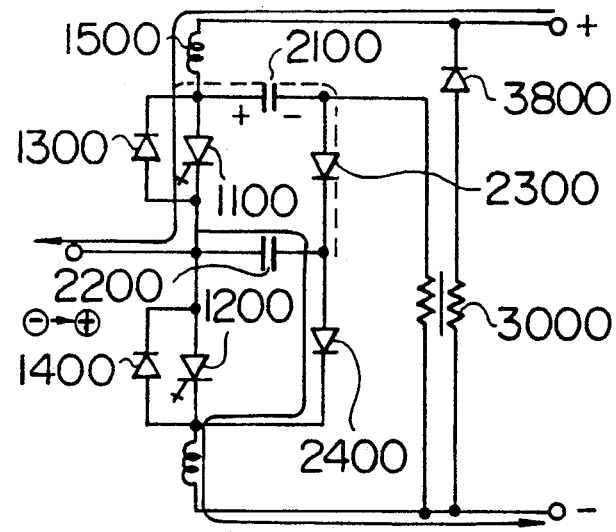
Figure 3E:
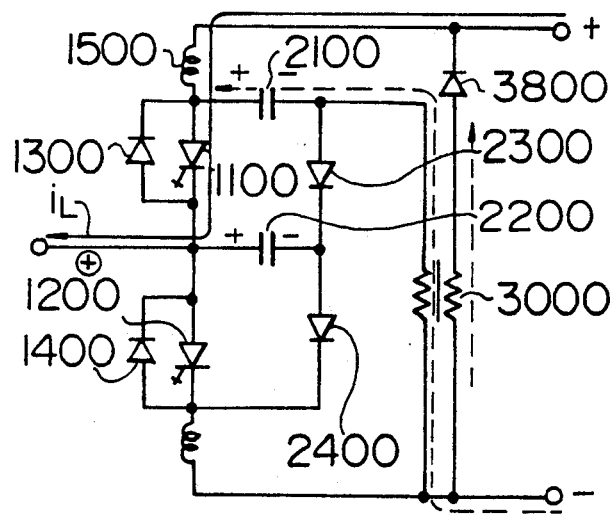
Figure 3F:
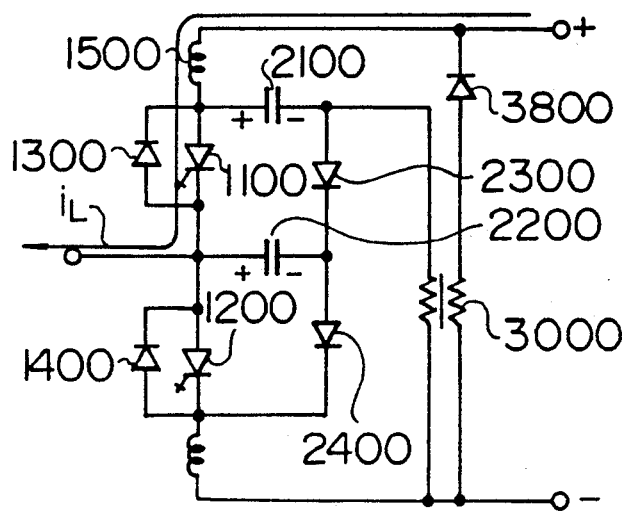

As shown in FIG. 3D, after an off-gate signal is applied to the GTO thyristor 1200, when an on-gate signal is applied to the GTO thyristor again, the capacitor 2200 is charged and the switching surge is absorbed. The current flows into the GTO thyristor 1100 to be returned to the state as shown in FIG. 3F (that is the same as that of FIG. 3A) via the state of FIG. 3D. Incidentally, in the current commutation operation of FIGS. 3C to 3F, the output voltage polarity is changed from negative to positive with the load current being positive so that the states of FIGS. 3C to 3F are equivalent to the advanced power factor state, i.e., an advanced-phase driving state.

Figure 4A:
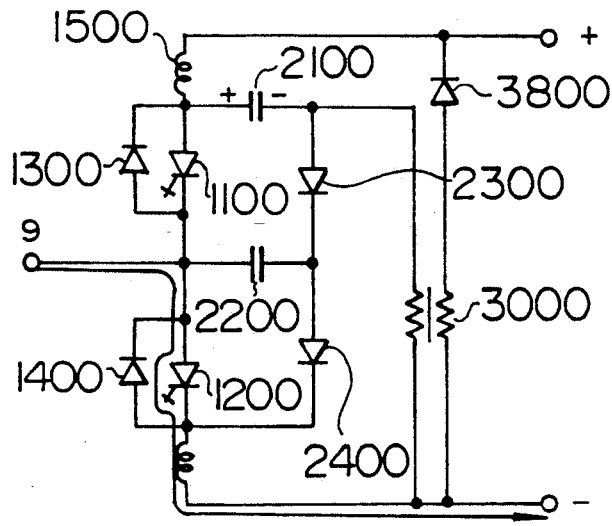
Figure 4B:
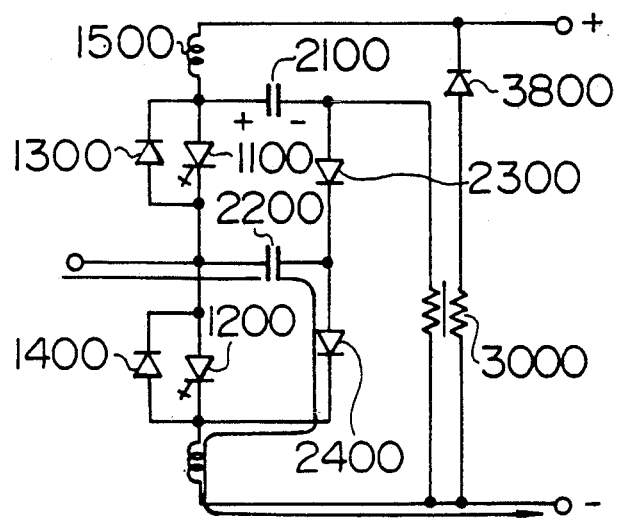
Figure 4C:
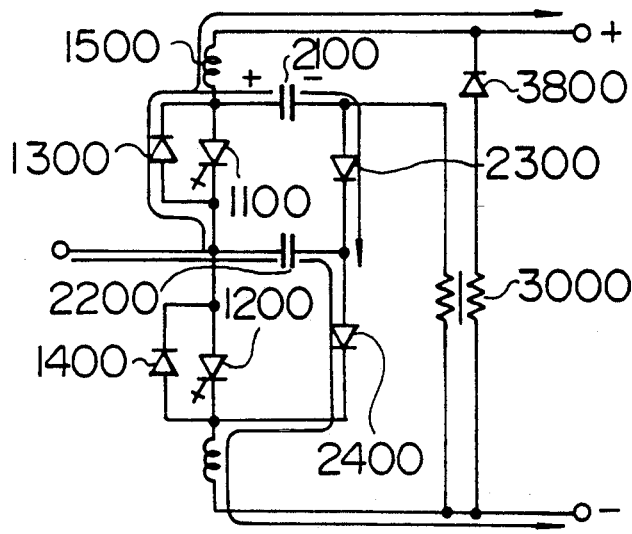
Figure 4D:
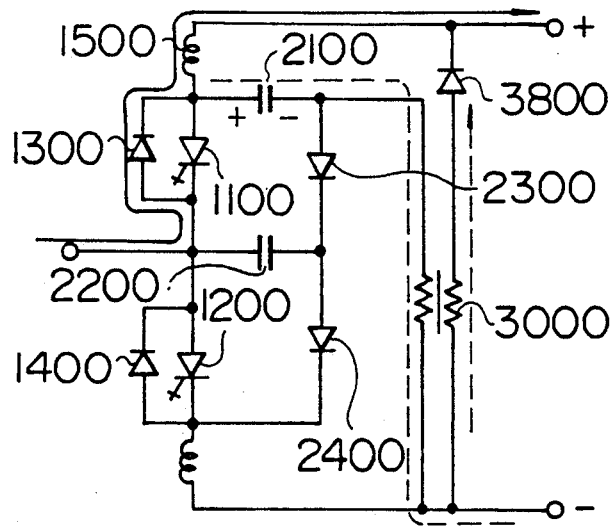
Figure 4E:
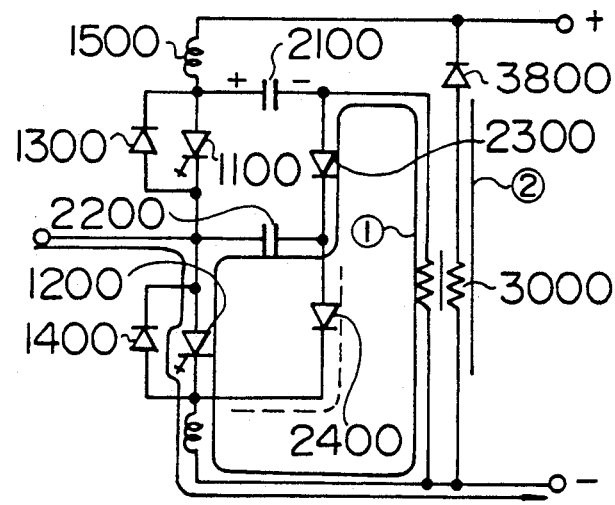
Figure 4F:
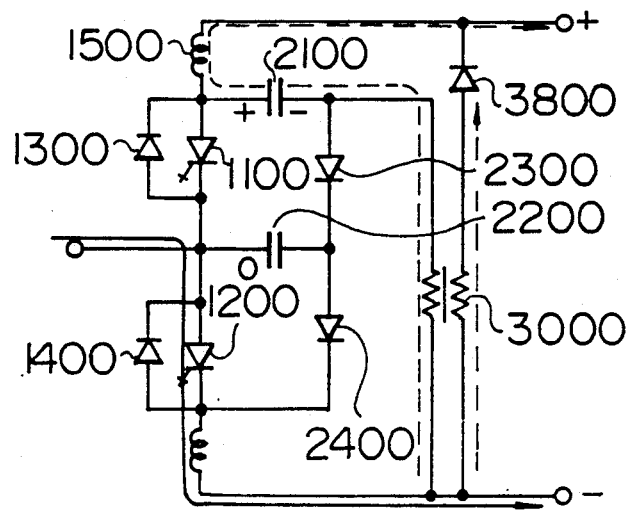

FIGS. 4A to 4F show the circuit operation in which the current flow state of the negative arm is returned to the same state via the current flow state of the positive arm. The current commutation operations in FIGS. 3A to 3D are commutation operations in the delayed-phase mode as in FIGS. 3A to 3C. The current commutation operations in FIGS. 4D to 4F are the commutation operations in the advanced-phase mode as in FIGS. 3C to 3F. When the state of FIG. 4D is shifted to that of FIG. 4E, the energy stored in the capacitor 2200 cannot be released to the AC side owing to the current flowing from the AC terminal. Thus, when the GTO thyristor 1200 turns on, the energy is recovered to the DC side along the current path of (1) and (2) shown in FIG. 4E. In this way, the surge energy generated owing to the turn-off of the GTO thyristor is absorbed into the capacitor in the snubber circuit and the absorbed energy is recovered to the AC side or DC side as power in the both driving modes of phase advancing and phase delaying.

Figure 5:
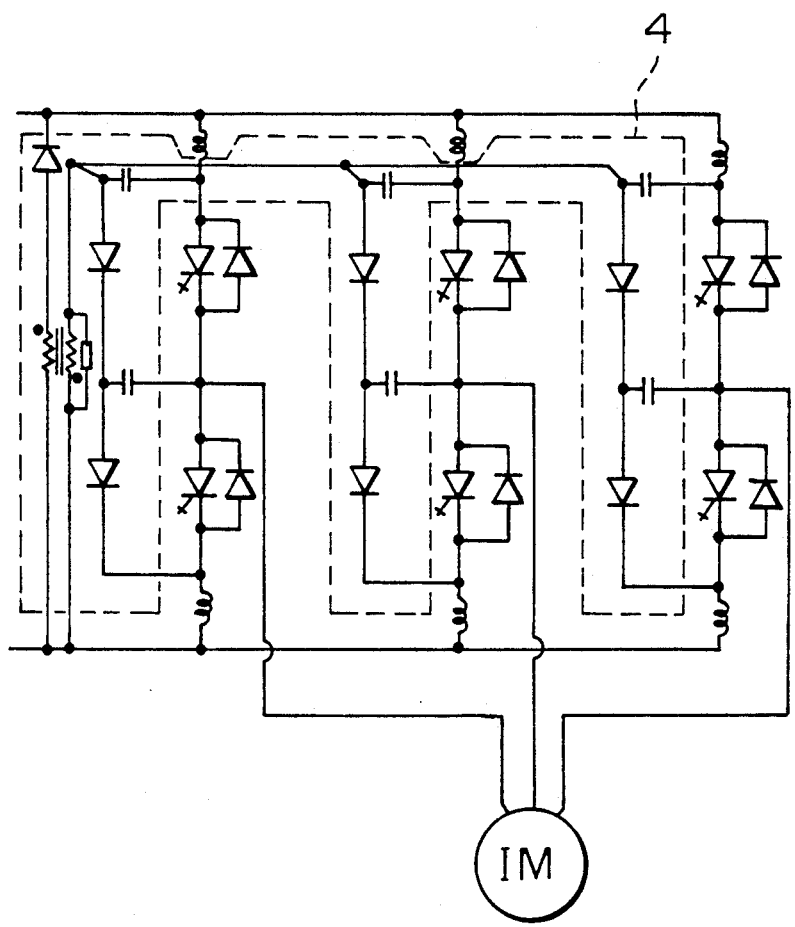
FIGS. 5 to 7, 8a, 8b are other detailed arrangements of the snubber circuit of the converter main circuit in FIG. 1.

FIG. 5 shows an arrangement for snubber energy recovering in which a transformer is not provided for each phase unlike FIG. 2 but for all the phases. This arrangement permits the snubber recovering system to be further small-sized.

Figure 6:
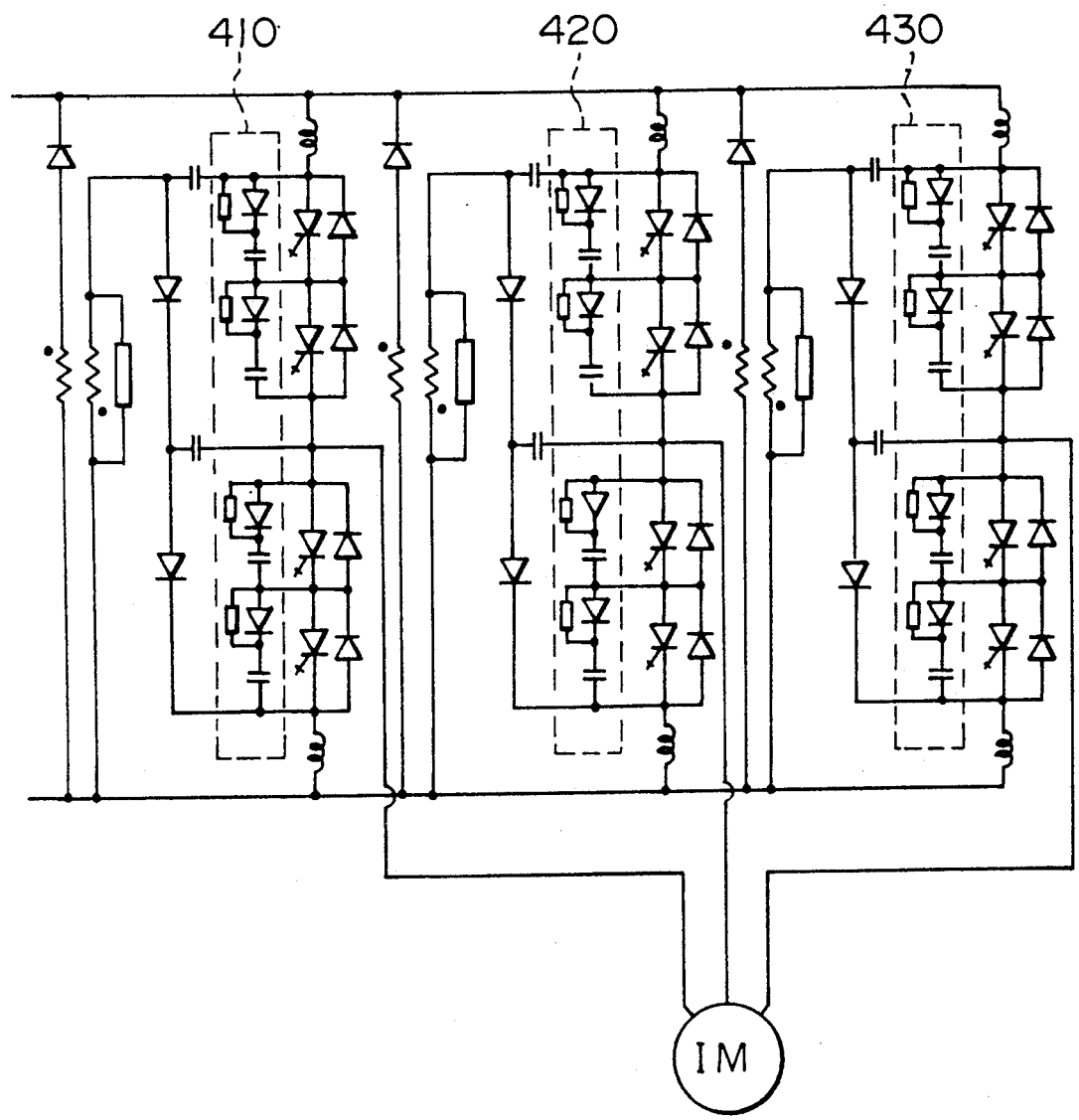
Figure 7:
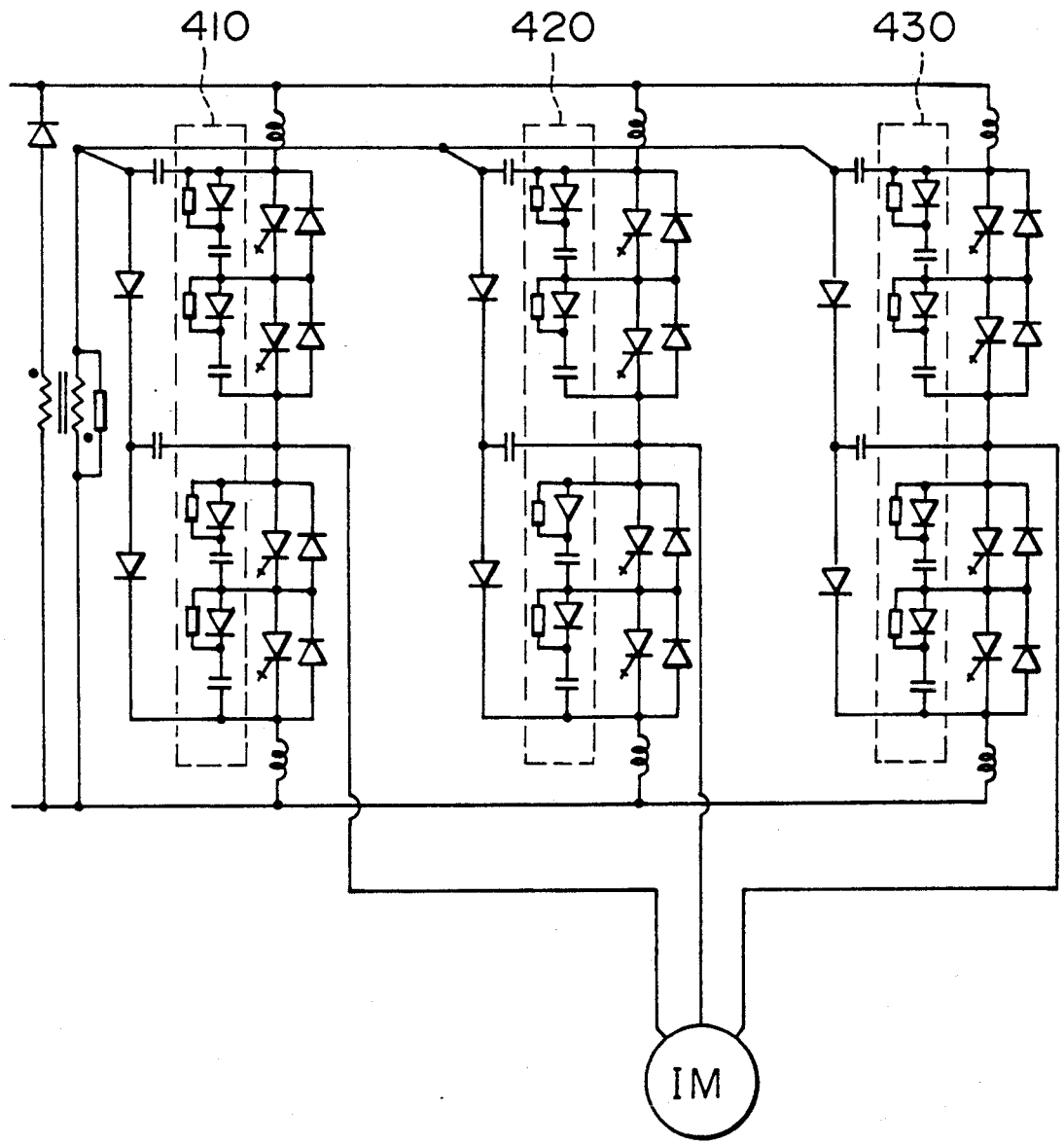

FIGS. 6 and 7 show an arrangement including GTO thyristors connected in series to cause the converter to have a large capacity. It should be noted that a transformer is not provided for each phase but for all the phases. In FIGS. 6 and 7, 410, 420 and 430 denote snubber circuits each provided with a diode, a capacitor and a resistor. The snubber circuits are individually connected with each GTO thyristor so that the sharing voltage of each of the GTO thyristors connected in series can be equalized.

Figure 8A:
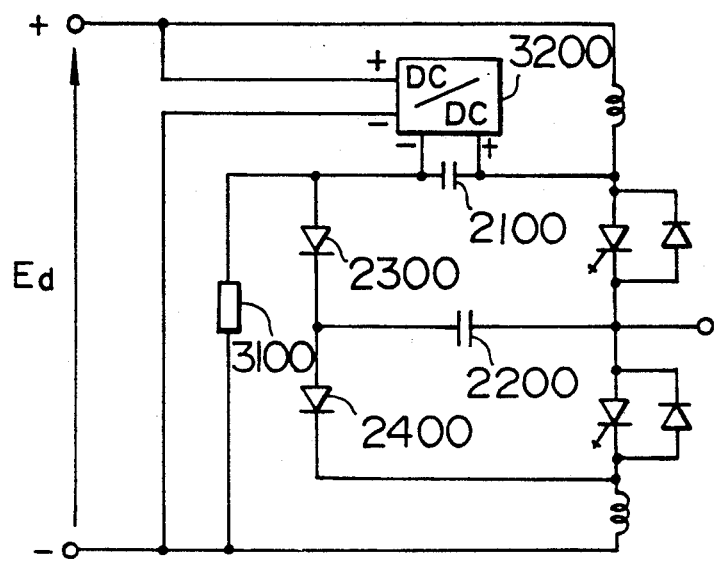
Figure 8B:
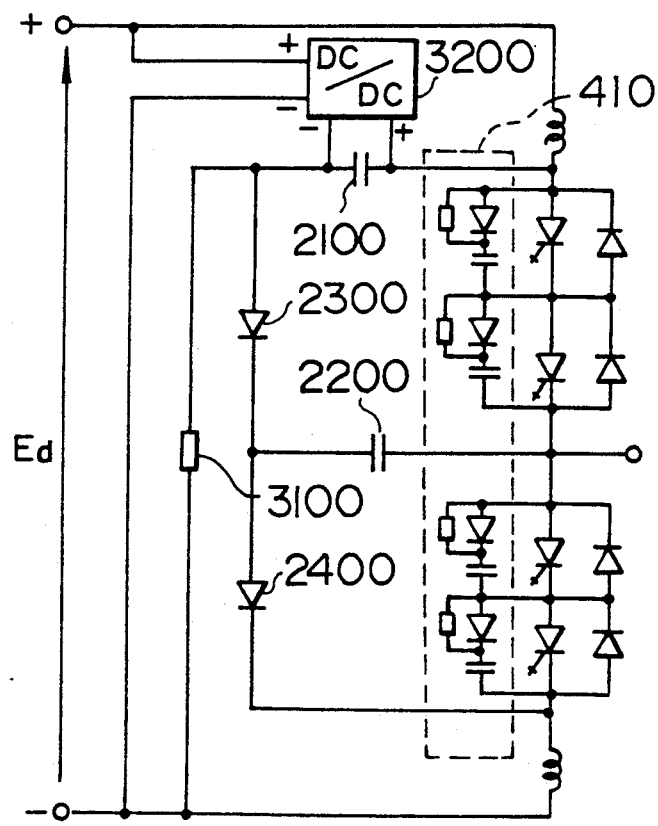

Although in this embodiment, the transformer 3000 is included in the snubber energy recovering circuit, a DC/DC converter 3200 may be used in place of the transformer as shown in FIGS. 8A and 8B. In comparison to FIG. 8A, the arm arrangement in FIG. 8B is composed of GTO thyristors connected in series. In FIGS. 8A and 8B, a capacitor 2100 is always charged to a DC voltage Ed; the excessively charged energy from the voltage Ed is recovered to the DC side.

The energy recovering system described above can provide the energy recovering rate of 80% or more. This is because in the case of using a transformer, the resistor for reset connected in parallel with the transformer has loss of 10–20%, and also in the case of using a DC/DC converter, the converter has loss at the same degree.

FIG. 9 shows the loss and efficiency of a power converter when an induction motor is driven by the power converter in which the converter and inverter are connected in multi-parallel. With the capacitance of 2700 kVA (1350 kVA×2) of the power converter concerned, the turn on/off switching loss of GTO is reduced to 33 kW; the snubber loss can be reduced to 40 kW by the energy recovering circuit; and the other loss of e.g. an inter-phase reactor is 29 kW. The total efficiency of the converter of 96.2% could be attained.

Figure 10:
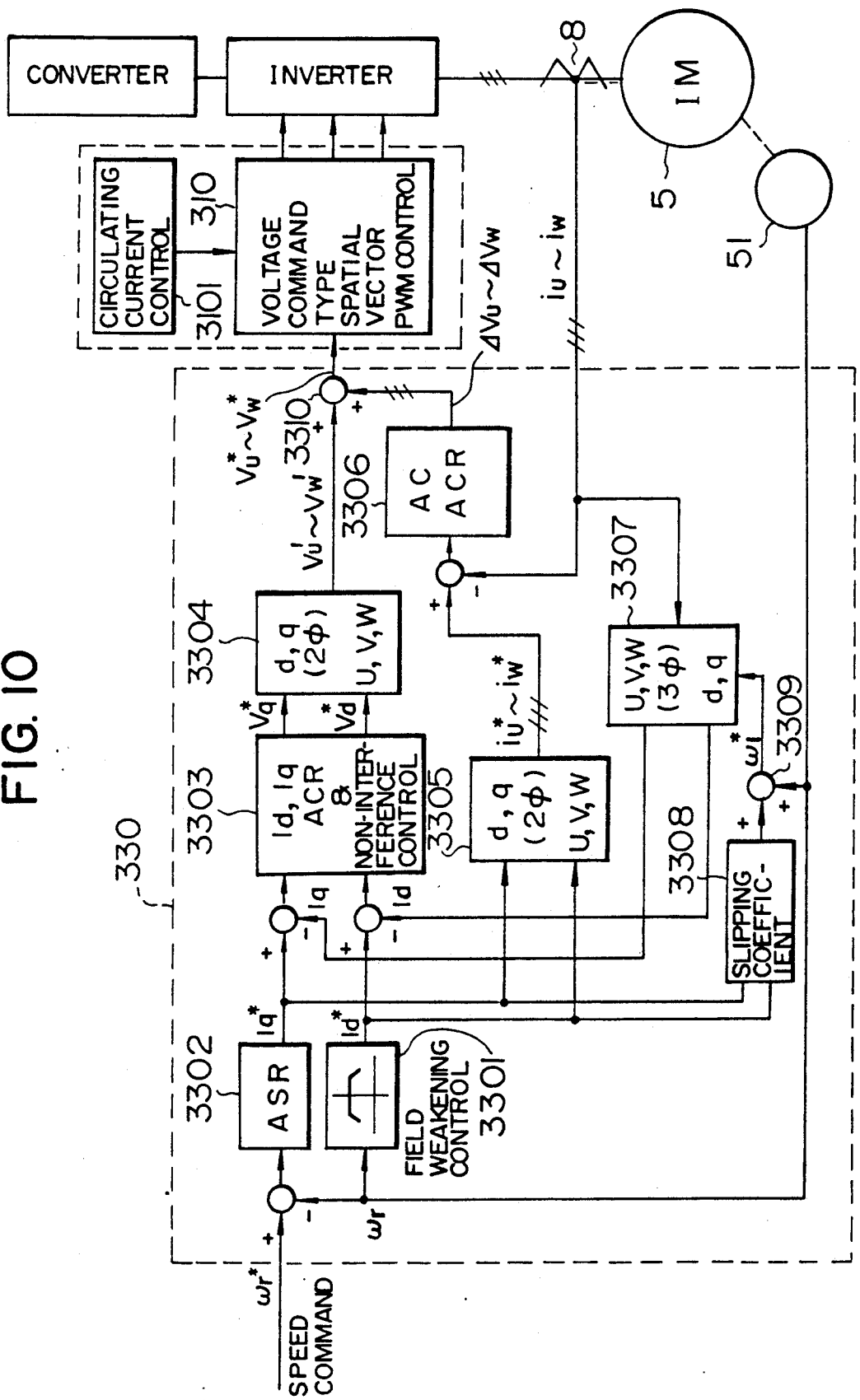
FIG. 10 is a view showing a detailed arrangement of the speed/vector control unit in FIG. 1.

FIG. 10 shows an arrangement of the speed/vector control circuit 330 included in FIG. 1. This arrangement is composed of a speed adjusting device 3302 for generating a torque current command $Iq^*$ on the basis of a difference between a speed command $\omega^*$ and the rotating speed $\omega$ of the three-phase electric motor detected by a speed detector 51, a field weakening control circuit 3301 for generating an excited current command $Id^*$ from the rotating speed $\omega r$, a slip calculator 3308 for calculating the slipping frequency $\omega s$ on the basis of the torque current command and the excited current command, an adder 3309 for adding the slipping frequency and the rotating speed to calculate a first order frequency $\omega_1^*$, a converter 3307 for converting the three-phase AC currents iu - iw detected by a current detector 81 into the currents Id and Iq corresponding to the torque and excited component, a DC current adjusting device 3303 for generating a voltage command $Vq^*$ from the difference between the command value $Iq^*$ and detected value Iq of the torque current and for another voltage command $Vd^*$ from the difference between the command value and detected value of the excited current, a converter 3304 for converting the above $Vq^*$ and $Vd^*$ into three-phase voltage commands vu' to vw', a converter 3305 for converting the current component commands $Iq^*$ and $Id^*$ into three-phase current commands iu* to iw', an AC current adjusting device 3306 for generating corrected voltages $\Delta vu$ to $\Delta vw$ from the differences between the these three-phase voltage commands iu* to iw* and detected values, and an adder 3310 for adding the three-phase voltage commands and the corrected voltages to calculate first order voltage commands vu* to vw*.

An instantaneous spatial vector PWM control unit 310 serves to PWM-control the output voltage from the inverter on the basis of the above first order voltage commands. In the case where the inverters are in multi-parallel connection, the control unit 310 is provided with a circulating current control unit 3101 for suppressing the current circulating through the inverter units. Incidentally, although the above control arrangement is shown in block form in which the signals are processed in an analog manner, the control/processing in the present invention is actually carried out using a microcomputer.

Now it should be noted that the response characteristic of the speed control system (ASR) depends on the magnitude of the inertia of a load and the response characteristic of the current control system (ACR). It is generally recognized that stabilized speed control can be made if the response of ACR is 5 to 10 times as large as that of ASR. In vector control system according to this embodiment, the DC ACR for Id and Iq is used so that all the vectors can be processed in DC magnitudes. The DC ACR can control the current in a more stabilized manner and with less control error than an AC ACR dealing with an instantaneous value and thus is not required to have a higher current control response than in the AC ACR. Additionally, an AC ACR 3306 provided in this embodiment is provided to reduce only the output current distortion due to the dead time of the switching devices in the main circuit.

Further, in the vector control according to this embodiment, the respective components of the torque current and magnetic flux are controlled individually so that the stabilized high-speed speed control characteristic for a load change (load torque change) can be obtained.

Figure 11A:
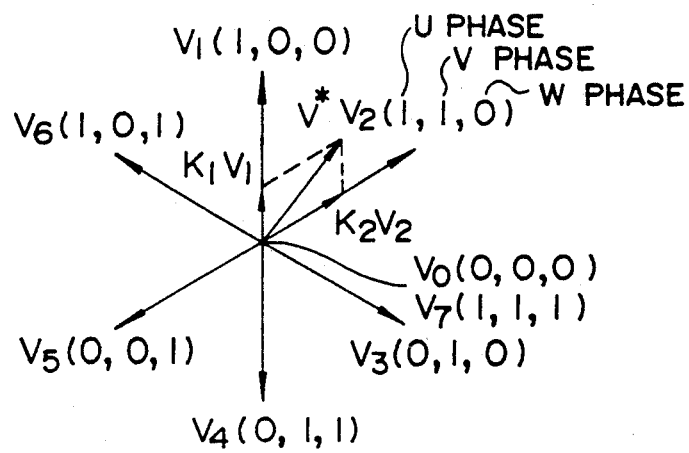
FIGS. 11a–11c and 12 are views for explaining the operation of instantaneous spatial vector PWM control.
Figure 11B:
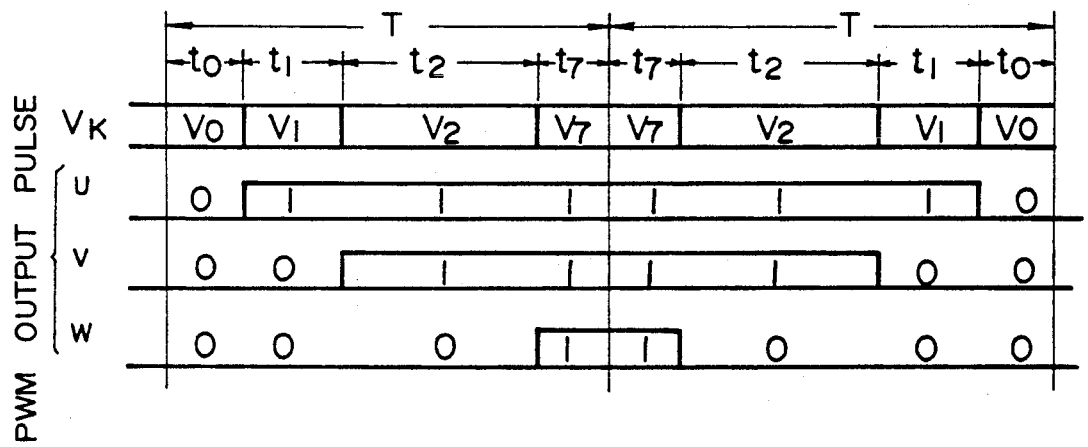

Now referring to FIGS. 11A and 11B, an explanation will be explained on the instantaneous vector PWM control unit 310 included in FIG. 1.

The three-phase single inverter comprises eight switching states. FIG. 11A shows these switching states in a spatial coordinate. These states are expressed as output voltage vectors of $V_0$ to $V_7$. A voltage command is also managed as a spatial vector, and the voltage command vector $V^*$ is expressed as a first order combination of the output vectors from the inverter. The switching state corresponding to the voltage vector is produced during the pulse duration in proportion to its coefficient.

Then, in order to obviate any redundant switching, with respect to the output voltage vector, only the vector located at the apex of a triangle including the voltage command vector is selected. In the case of FIG. 11A, the selected vectors are $V_1$ and $V_2$, and zero vectors of $V_0$ and $V_7$. Further, in order to reduce the amount of switching, the voltages are outputted in the order of $V_0$—$V_1$—$V_2$—$V_7$—$V_2$—$V_1$—$V_0$. The outputting time tk of each of the voltage vectors can be calculated.

$$V^* = \frac{1}{T}(t_1 V_1 + t_2 V_2 + t_0 V_0 + t_7 V_7) \quad (1)$$

$$T = t_1 + t_2 + t_0 + t_7 \quad (2)$$

where T is a sampling period. Although the sum of t0 and t7 can be calculated from the above two equations, they cannot be separated. So, the following condition is also given, $$t_0 = t_7 \quad (3)$$

This is because in outputting the zero voltage vector, the torque ripple can be made smaller by outputting it during equal times than increasing the time taken to be once outputted since in view of its degree of out-of-phase from the command vector.

Figure 11C:
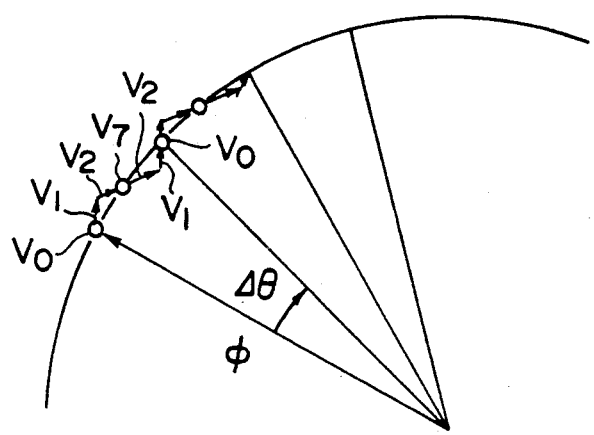

Specifically, as shown in FIG. 11C, the optimum voltage vectors $V_0$ to $V_7$ are selected within a angle $\Delta\theta$ within which the crossing magnetic flux vector $\phi$ crossing the secondary winding of the electric motor during a sampling period T advances. The crossing magnetic flux vector $\phi$ makes an approximately circle locus rotating at the angular speed of $\omega$. Thus, the torque ripple attendant on the change in the magnetic flux is reduced.

Figure 12:
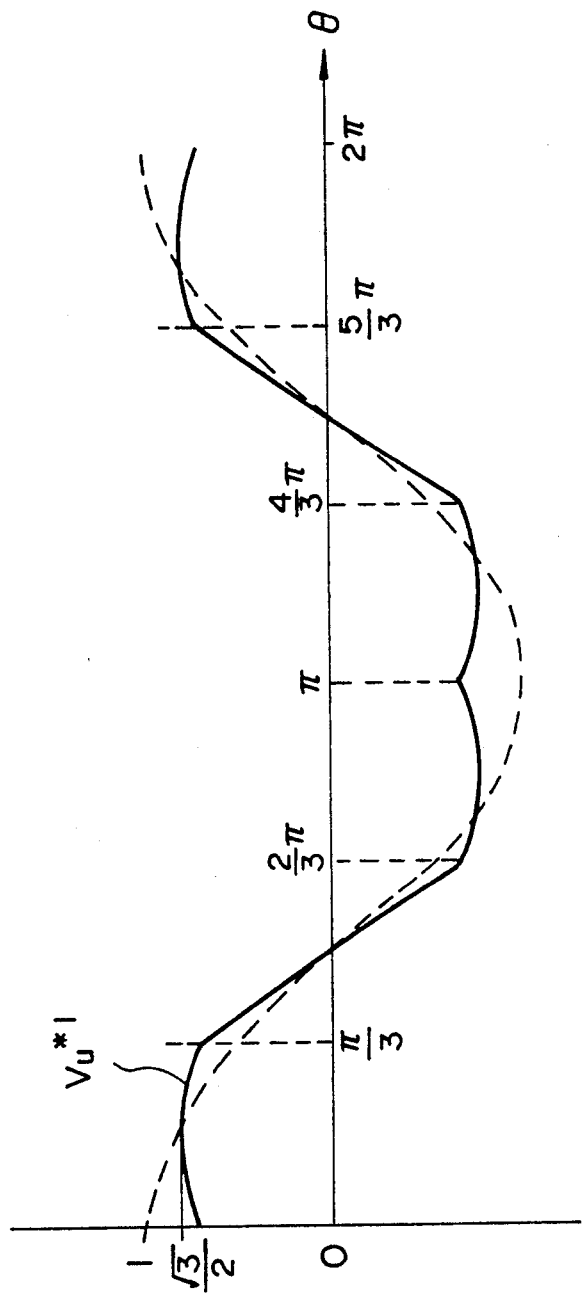

The phase voltages of the inverter viewed from the change in the pulse durations due to the instantaneous spatial vector PWM control are shown in FIG. 12. The maximum value is $\sqrt{3}/2$ of a sine wave modulated type SH (sub-harmonics) system. Thus, the maximum value of the phase voltage which can be outputted without being saturated is $2/\sqrt{3} = 1.15$ of the SH system so that the voltage using rate can be increased.

The PWM system according to this embodiment has the following advantages.

(1) By equalizing the output times of the zero voltage vectors ($V_0$ and $V_7$), the torque ripple can be reduced (a torque ripple of 1% or less can be attained at the switching at 1 kHz).

(2) The maximum voltage using rate can be improved by 15% as compared with the conventional sine wave modulation SH system. Therefore, the input DC voltage for the inverter may be smaller by 15% so that a switching device with a relatively low breakdown voltage can be used.

(3) Since the PWM operations corresponding to three phases are collectively processed, the operation time required is short and so the burden for the microcomputer used can be relaxed.

However, in the case where the multiple inverter is to be controlled, the number of output voltage vectors is increased to 19 and the number of combined modes is increased to 24 so that it takes a long time period is required to determine the mode.

In order to obviate such an inconvenience, the multiple inverter will be PWM-controlled by the spatial vector type SH system described below. The principle of this system is to form the modulated wave analogous to the phase voltage (FIG. 12) obtained by the instantaneous spatial vector PWM control and to form a PWM pulse on the basis of the modulated using an algorithm in the SH system.

Figure 13:
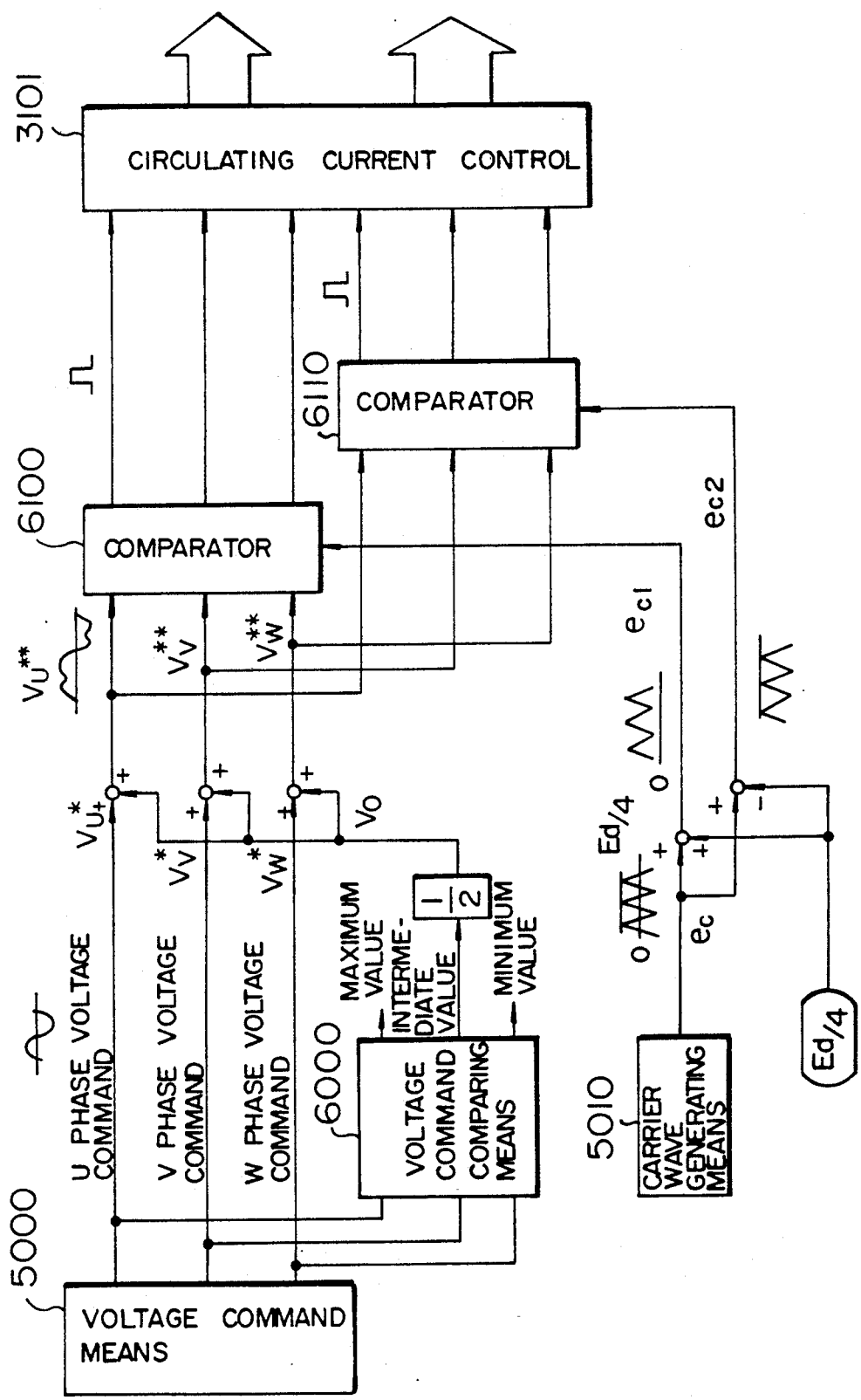
FIG. 13 is a view showing an arrangement for the PWM control in a spatial vector type SH system.

FIG. 13 shows an arrangement of the spatial vector type SH system for PWM controlling the parallel-multi inverter system in block form. A voltage command means 5000 generates sine-wave three phase instantaneous voltage commands $V_u^*$ - $V_w^*$. A voltage command comparing means 6000 compares the values of these three phase instantaneous voltage commands to produce an intermediate value among them. The value $V_0$ that is ½ of the intermediate value of the voltage commands is added to the above respective phase voltage commands to form modulated wave signals $V_u^{}$ - $V_w^{}$ which are in turn supplied to comparators 6100 and 6110. A carrier wave generating means 5010 generates a triangular wave $e_c$ at the frequency fc with the peak value of the signal that equals to ¼ of the inverter input DC voltage Ed. The signal corresponding to ¼ of the DC voltage Ed is added to the triangular wave $e_c$ to form a first carrier wave $e_{c1}$, and the former is subtracted from the latter to form a second carrier wave $e_{c2}$. The comparator 6100 compares the above modulated wave signals $V_u^{}$ - $V_w^{}$ with the first carrier wave $e_{c1}$ for each phase to form PWM signals for the first unit inverter. Likewise, the comparator 6110 compares the above modulated wave signals $V_u^{}$ - $V_w^{}$ with the second carrier wave $e_{c2}$ for each phase to form PWM signals for the second unit inverter. A circulating current control means 3101 processes the thus formed PWM signals so as to suppress the current circulating through the unit inverters.

FIGS. 14A to 14F show the PWM operation waveform of the multi-inverter system in the spatial vector type SH system. The voltage command correction signal $V_0$ is the value that is ½ of the intermediate value among the three phase voltage commands. The modulated wave $V_u^{**}$ (only the U phase is shown in FIG. 14C) is obtained by adding the corrected signal $V_0$ to the voltage command for each phase; this modulated wave is equivalent to the phase voltage waveform obtained by the instantaneous spatial vector system as shown in FIG. 12. The voltage (FIGS. 14A and 14B) for each phase of the inverter results in a three-level PWM pulse waveform obtained by comparing the modulated wave with the double carrier waves. As seen from FIG. 14F, in terms of the line-to-line voltage, the PWM switching frequency is twice as high as the carrier wave frequency.

It can be understood from the above description that if the multi-inverter system is PWM-controlled by the spatial vector type SH system, with the same output PWM pulse waveform as in the instantaneous spatial vector system, the time required for the PWM operation can be reduced by 1/5 or less. Thus, the burden to the microcomputer for performing the PWM operation can be relaxed so that the number of times of sampling in the current/speed control system can be increased to that degree, thus improving the response characteristic of the control system.

Figure 15B:
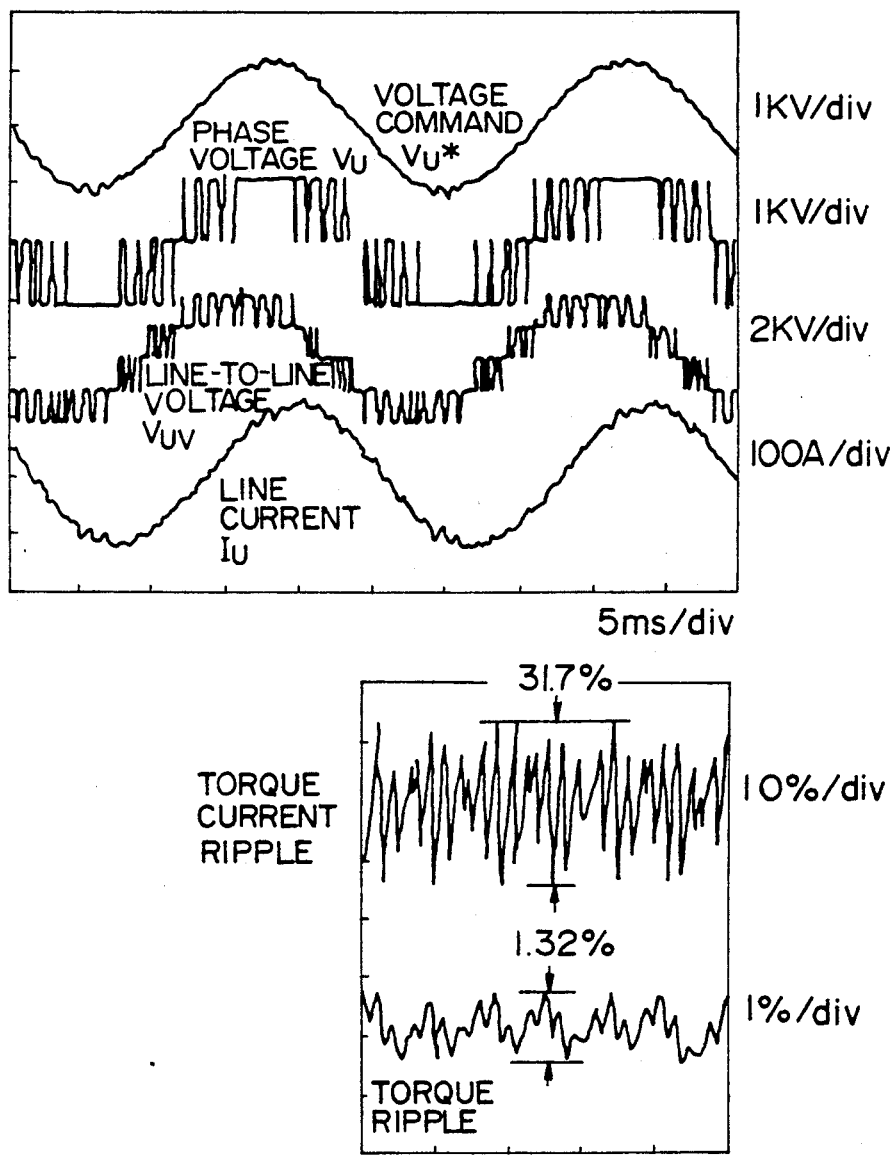

FIGS. 15A and 15B show operation waveforms when an induction motor is driven by the multi-inverter system. The specifications at this time are as follows: A unit inverter has a capacitance of 1350 kVA, an input DC voltage of 4 kV, a switching frequency of 500 Hz, an output frequency of 40 Hz and the induction motor has an output power of 2000 kW, an input voltage of 2000 V and four poles and four poles. FIG. 15A shows the waveforms when the multi-inverter system is PWM-controlled by the spatial vector type SH system, and FIG. 15B shows the waveforms when it is PWM-controlled by the sine wave modulated type SH system. In the sine wave modulated type SH system, the voltage command is saturated so that the phase voltage in a pulse thinned-out state (PWM control is not made at the center of the phase voltage) thus, the current ripple and torque ripple are relatively large.

On the other hand, in the spatial vector type SH system, the modulated waveform is flat in the neighborhood of the maximum value of the voltage command so that the voltage command is not saturated and so the phase voltage does not reach the pulse thinned-out state to provide substantially fixed pulse intervals. The pulse intervals of the line-to-line voltage are also substantially fixed which means an improved voltage using rate,Y. The torque ripple can be reduced to 1% or, less as shown.

Figure 16:
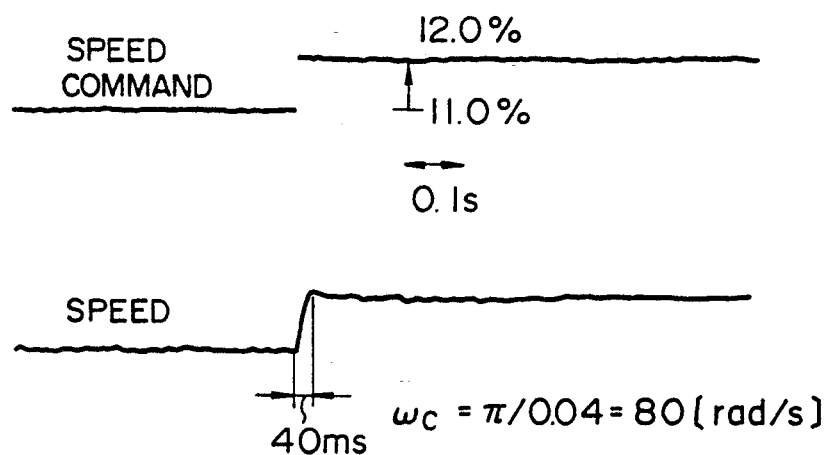
FIG. 16 is a view of the actual measurement result of the speed response characteristic.

FIG. 16 shows the response characteristic of a speed stepwise change. As seen from FIG. 16, the actual speed of the electric motor swiftly responds to the stepwise change to provide the response characteristic of 80 rad/s.

Figure 17:
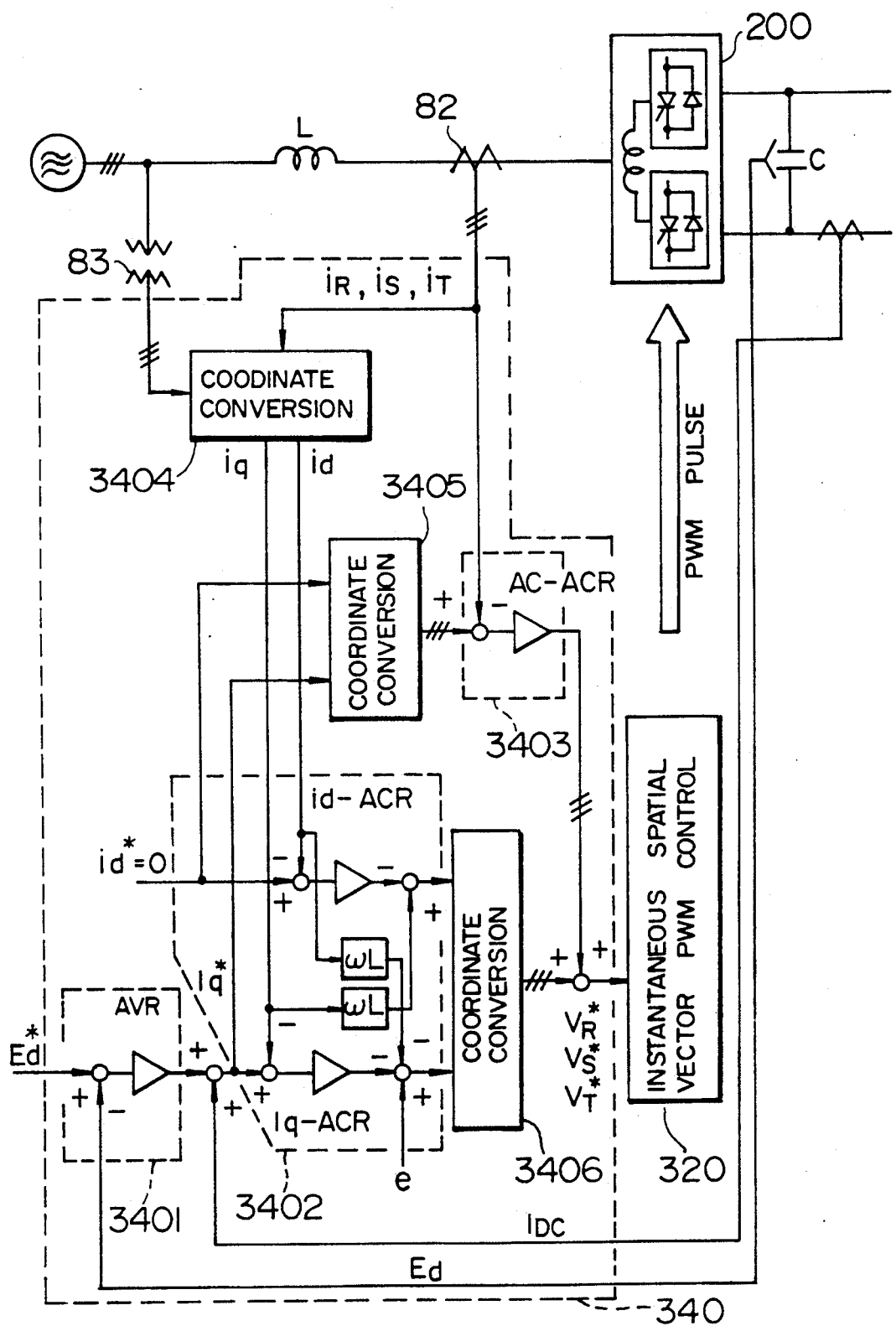
FIG. 17 is a view showing a detailed arrangement for power factor arrangement and voltage control in FIG. 1.

Referring to FIG. 17, an explanation will be given of an arrangement of the power factor adjustment voltage control unit 341 included in the control means 300 for the converter 200 in FIG. 1. Its schematic arrangement is the same as that of the control device for the inverter as shown in FIG. 10 but different from the following points. On the input side of the converter, three-phase AC voltage phases and three-phase AC currents are detected by detectors 83 and 82. On the basis of the three-phase AC voltage phases, a coordinate converter 3404 detects valid and invalid currents iq and id in DC magnitudes from the three-phase AC currents $i_R$, $i_S$ and $i_T$. A voltage adjusting circuit (AVR) is provided to cause the DC current Ed detected on the output side of the converter to coincide with the command value Ed*. A valid current command iq* is obtained from the sum of the output from the AVR and the DC current Idc after the converter output is smoothed by a capacitor. Using this command thus obtained, a DC current adjuster (Id, Iq - ACR) 3402 adjusts the DC currents so that the invalid current becomes zero and the valid current becomes its command value, thus producing DC voltage signals corresponding respective components. These voltage signals are supplied to a coordinate converter 3406 to provide three phase AC voltage signals. An AC current adjuster (AC - ACR) 3403 serves to reduce an input current distortion to generate corrected voltage signals on the basis of differences between the values obtained by converting id* and iq* into three phase AC current command signals by a coordinate converter 3405 and the above detected three phase AC current values. The corrected voltage signals are added to the output signals from the coordinate converter to provide three phase command signals $V_R^*$, $V_S^*$ and $V_T^*$. An instantaneous spatial vector PWM control unit 320 creates PWM pulses on the basis of the three phase command signals and PWM-controls the converter 200 using these PWM pulses. It should be noted that the instantaneous spatial vector PWM control unit 320 performs the same operation as the above instantaneous spatial PWM control unit 310 for the inverter 100. Incidentally, in the case of using the multi-inverter system, in order to shorten the PWM operation processing time, the PWM control unit 310 is operated in the above spatial vector type SH system.

Figure 18A:
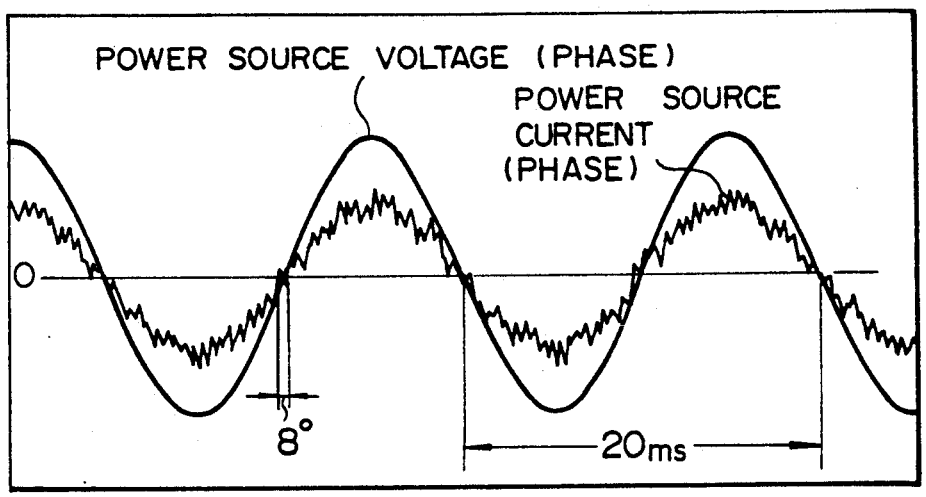
FIG. 18A and 18B are waveform charts of the characteristic obtained by the control by the arrangement shown in FIG. 17.
Figure 18B:
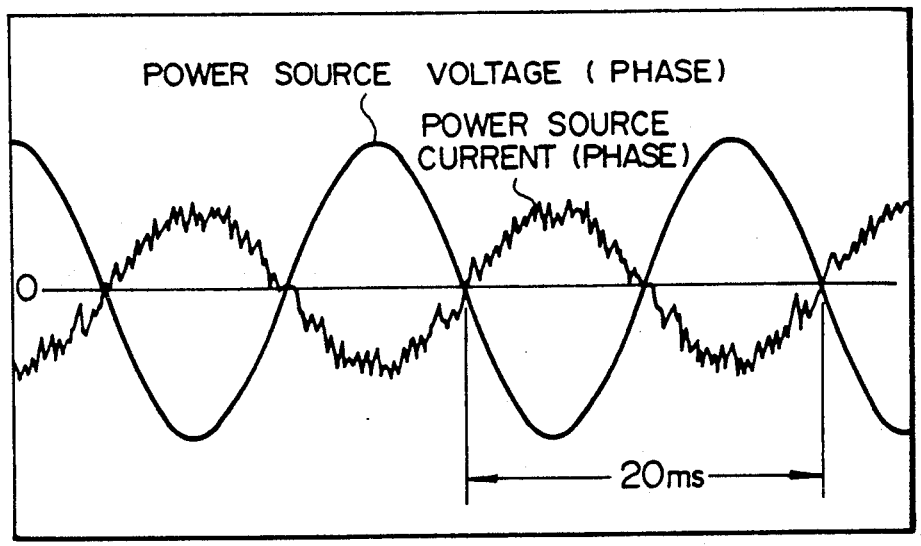

FIGS. 18A and 18B show waveforms of the phase voltage and phase current of the three-phase AC power source on the input side of the converter system in the case the motor is driven by the multi-parallel converter system. The converter system has the specifications of a capacity of 1350 kVA for each unit, a power source voltage of 2 kV, a power source frequency of 50 Hz and a switching frequency of 500 Hz.

FIG. 18A is directed to a power running whereas FIG. 18B is directed to a regenerative running. In both cases, although the current waveform is composed of a basic wave and a ripple slightly overlapping therewith due to the PWM switching at 1 kHz, the phase difference between the voltage and the basic wave of the current is 8° or less so that the power factor for the basic wave of about 99% can be obtained.

In accordance with the first embodiment of the present invention, in the large capacity (2000 kVA or more) variable speed driving system for an AC electric motor, in the case where a GTO thyristor with its permissible switching frequency of 500 Hz is used as a switching device in the main circuit of each of a converter and an inverter constituting an electric power converter, a plurality of inverters are connected in parallel in a multiplex manner and the output voltages from the inverters are controlled through instantaneous spatial vector PWM control. In this way, the torque ripple of the AC electric motor can be reduced to 1% or less. Since the snubber circuit to be connected with the switching GTO thyristors in the main circuits in the converter and the inverter is provided with snubber energy recovering means, the efficiency of power conversion can be improved to 95% or more. The vector control for the motor, multi-parallel connection of the inverters and the PWM control in instantaneous spatial vector or spatial vector type SH system can improve the speed response of the motor to 60 rad/s or more. Further, the multi-parallel connection of the converters, the power factor adjusting circuit and the PWM control in instantaneous spatial vector or spatial vector type SH system can improve the power factor of an AC power source to 98% or more.

Further, in order to provide the above advantages, in the first embodiment, GTO thyristors with their permissible switching frequency of 500 Hz are used in the main circuits of the power converters in multi-parallel connection, but in the case of using a single power converter, GTO thyristors with their permissible switching frequency of 1 kHz or more may be used to provide the same advantage. In this case, however, if the permissible switching frequency is enhanced, the permissible switching current must be decreased in view of the characteristic of GTO thyristor. As a result, the capacitance of the power converter is decreased by half of the previous case, thus providing a large capacity variable speed AC motor driving system with the capacity of 1000 kVA.

Figure 19:
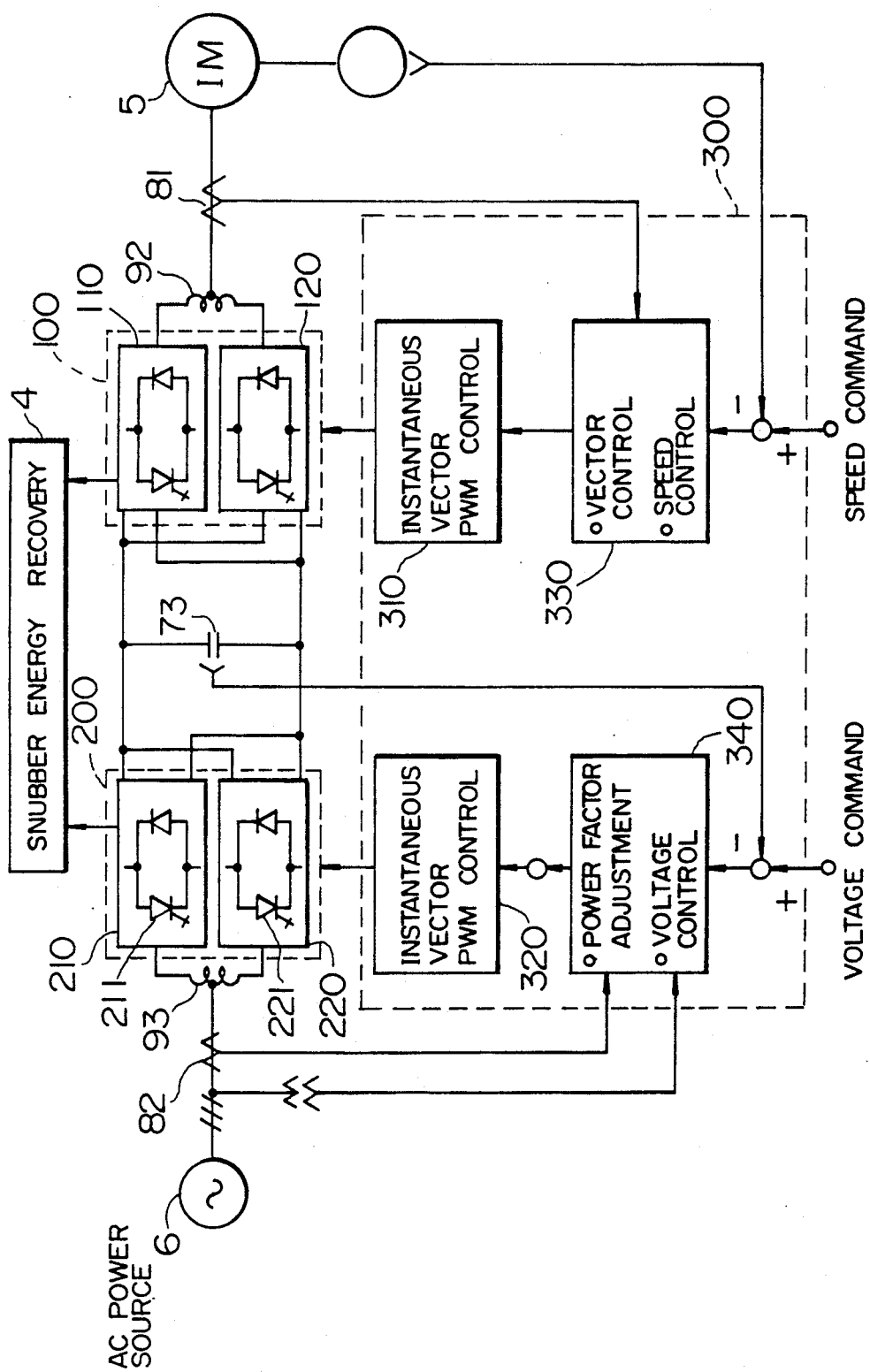
FIG. 19 is a view of an arrangement of the large capacity AC power electric power variable speed system according to the second embodiment of the present invention.

FIG. 19 is an arrangement of the large capacity variable speed AC motor driving system according to the second embodiment of the present invention. In the first embodiment shown in FIG. 1, the unit converter 210 and the unit inverter 110 are connected through the capacitor 71, and also the other unit converter 220 and the other unit inverter 120 are connected by the other capacitor 72. On the other hand, in this embodiment, two unit converters and two unit inverters are connected with each other through a common capacitor 73 but not through the above two capacitors. In accordance with this embodiment, the capacitance of capacitors constituting a DC circuit can be reduced to about ½ of the total capacitance in the first embodiment so that the capacitor size can be increased.

Figure 20:
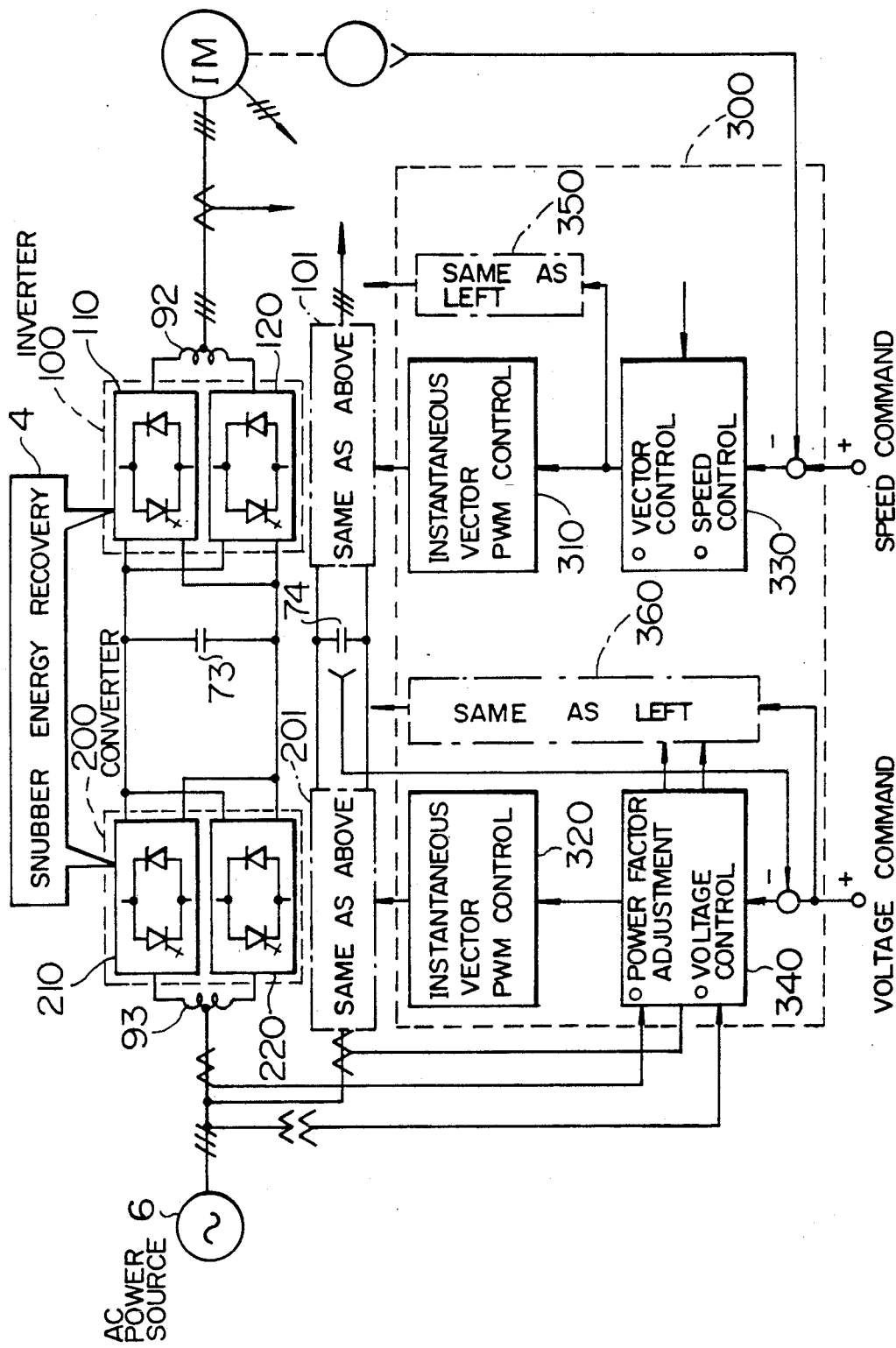
FIG. 20 is a view of an arrangement of the large capacity AC power electric power variable speed system according to the third embodiment of the present invention.

FIG. 20 shows an arrangement of the large capacity variable speed AC motor driving system according to the third embodiment of the present invention. In the embodiment shown in FIG. 1, the motor is a three phase motor whereas in this embodiment, the motor used is a multi-phase (six phase, nine phase, ..., 3n (n=2, 3, 4, ...) phase) motor. The system including such a multi-phase motor can be easily realized by increasing the number of sets each composed of the three-phase converter 200 and inverter 100 in accordance with the number of phases of the motor used. In accordance with this embodiment, the large capacity of the system can be realized and also adoption of the motor permits the torque ripple to be reduced.

Figure 21:
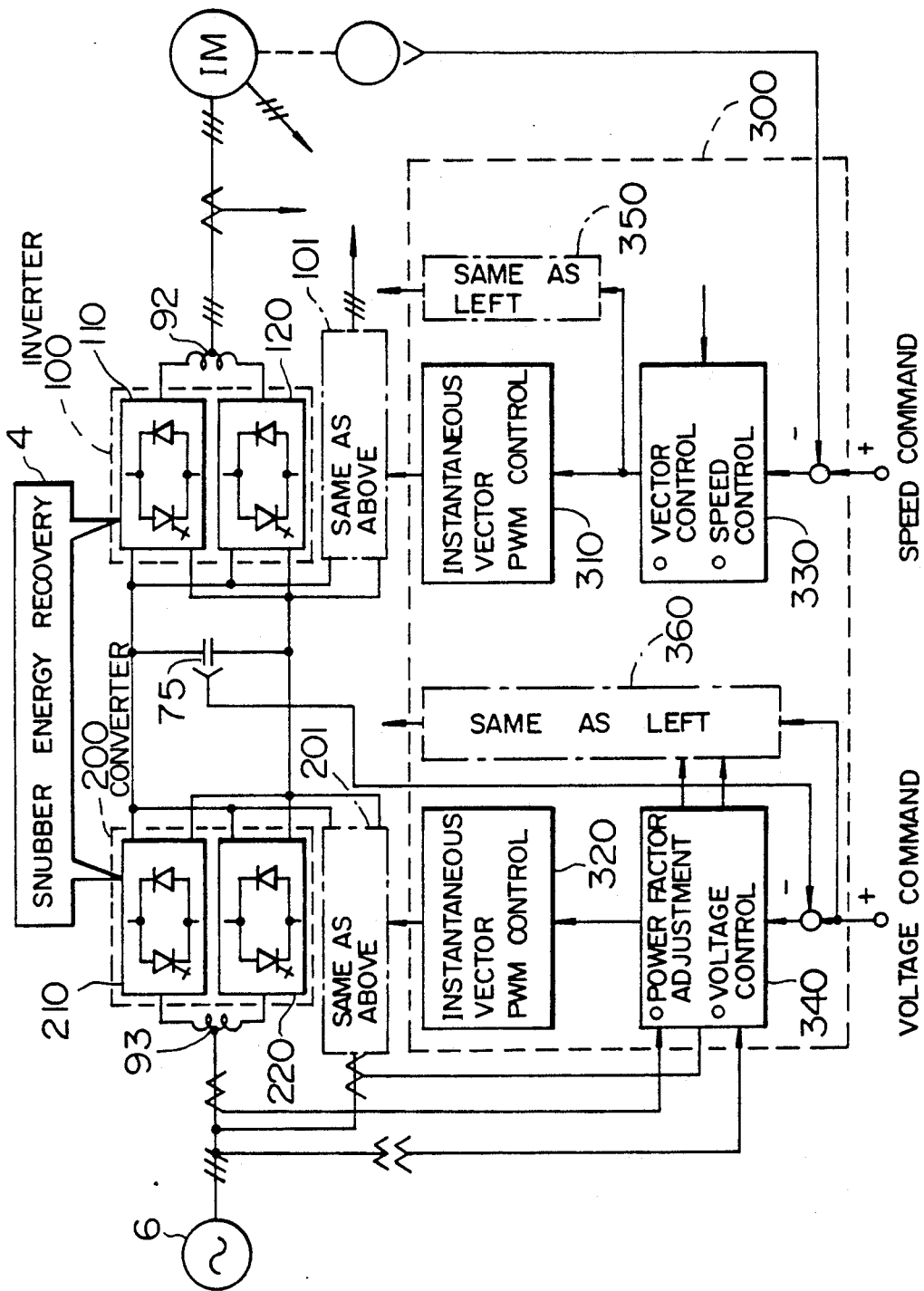
FIG. 21 is a view of an arrangement of the large capacity AC power electric power variable speed system according to the fourth embodiment of the present invention.

FIG. 21 is an arrangement of the large capacity AC motor driving system according to the fourth embodiment of the present invention. In this embodiment, the capacitors in the arrangement of the third embodiment are replaced by a common capacitor. In accordance with this embodiment, in the case of 3n phases, the total capacitance of the capacitors required can be reduced to 1/n so that the entire system can be made compact.

Figure 22:
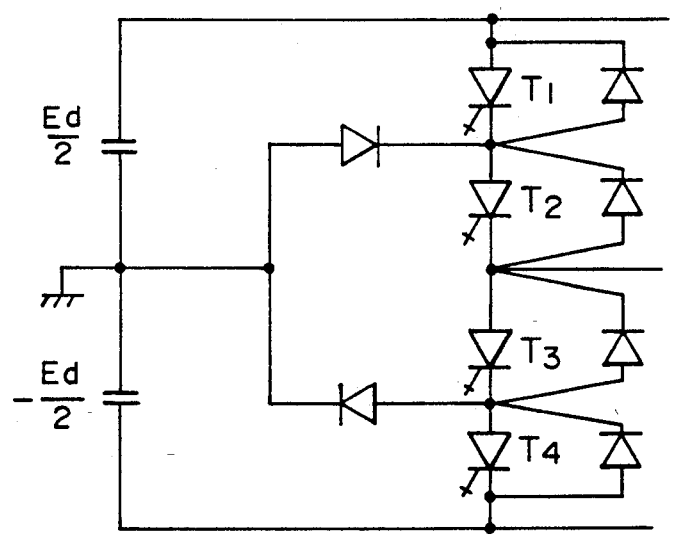
FIG. 22 is a view of an arrangement of a main circuit unit according to the fourth embodiment of the present invention.

FIG. 22 shows an arrangement of the main circuit according to the fifth embodiment of the present invention. Whereas in the embodiments previously described, in order to realize large capacity of the system, the converters and the inverters are connected in multi-parallel, respectively, in this embodiment, the main circuits of the converter and inverter are connected in multi-series to realize a large capacity system and the PWM switching at a high frequency. FIG. 22 shows one example of the multi-series connection circuit according to one phase. In a positive side arm, two GTO thyristors T1 and T2 are connected in series, and also in a negative side arm, two GTO thyristors are connected in series. One line extending from the middle point of a DC power source is connected with a junction between the GTO thyristors T1 and T2 through a diode in forward direction, and the other line is connected with a junction between the GTO thyristors T3 and T4 through another diode in a reverse direction. The input/output terminal of the phase concerned is connected with the junction between the GTO thyristors T2 and T3. Although not shown, it is needless to say that each GTO thyristor is connected with a feedback diode and a snubber circuit.

In the arrangement of the main circuit described above, the phase voltage at the input/output terminal of the phase is as follows in accordance with the switching states of the GTO thyristors. When both GTO thyristors T1 and T2 are 'on', the phase voltage is $Ed/2$ ($E_d$: DC power source voltage); when both GTO thyristors T2 and T3 are 'on', it is zero; and when both GTO thyristors are 'on', it is $-Ed/2$. In this way, the PWM operation waveforms shown in FIG. 14 which are the same as when the above multi-parallel inverter system is PWM-controlled in the spatial vector type SH system, and the phase voltage has the PWM pulse waveform at three levels. Accordingly, with respect to the line-to-line voltage, the PWM switching at the frequency twice as high as that of a carrier wave can be obtained.

In accordance with this embodiment, the interphase reactor and circulating current control circuit which are required in the multi-parallel system are not required so that the size of the entire system can be reduced.

If several embodiments of the present invention hitherto described is applied to driving a roller of a rolling mill system 900, the resultant low torque ripple and high response can enhances the precision of rolling.

We claim:

1. A large capacity variable speed driving system for driving an AC motor by an inverter having a capacity of 2000 kVA or more including self-igniting elements for converting DC power into AC power, comprising:
    an inverter system including a plurality of unit inverters connected in parallel in a multiplex manner; and
    a PWM (pulse width modulation) control device for controlling the output voltage from said inverter system;
    wherein said self-igniting elements are GTO thyristors with a switching frequency of 500 Hz or more, and said PWM control device is a spatial vector type sub-harmonic system; and
    wherein said spatial vector type sub-harmonic system includes:
    means for generating sine-wave three phase instantaneous voltage command signals $V_u^*$, $V_v^*$ and $V_w^*$;
    means for comparing the magnitudes of the three phase voltage command signals with one another to produce an intermediate value of the three phase voltage command signals;
    means for adding a value $V_o$, corresponding to half of the intermediate value, to the three phase instantaneous voltage command signals respectively to produce modulated wave signals $V_u^{}$, $V_v^{}$ and $V_w^{**}$;
    means for generating a triangular wave signal $e_c$ at a frequency $f_c$ having a peak value corresponding to ¼ of an input DC voltage $E_d$ to said triangular wave signal $e_c$;
    means for generating a second carrier wave $e_{c2}$ by subtracting the signal corresponding to ¼ of said input DC voltage $E_d$ from said triangular wave signal $e_c$;
    a first comparator for comparing said modulator wave signals $V_u^{}$, $V_v^{}$ and $V_w^{}$ with said first carrier wave $e_{c1}$ for each phase to form PWM signals for controlling a first unit converter; and a second comparator for comparing said modulated wave signals $V_u^{}$, $V_v^{}$ and $V_w^{}$ with said second carrier wave $e_{c2}$ for each phase to form PWM signals for controlling a second inverter unit.

2. A large capacity variable speed driving system for driving an AC motor by an inverter having a capacity of 2000 kVa of more including self-igniting elements for converting DC power into AC power, comprising:

an inverter system including a plurality of unit inverters connected in series in a multiplex manner; and a PWM (pulse width modulation) control device for controlling the output voltage from said inverter system;

wherein said self-igniting elements are GTO thyristors with a switching frequency of 500 Hz or more, and said PWM control device is a spatial vector type sub-harmonic system; and wherein said spatial vector type sub-harmonic system includes:

means for generating sine-wave three phase instantaneous voltage command signals $V_u^*$, $V_v^*$, and $V_w^*$;

means for comparing the magnitudes of the three phase voltage command signals with one another to produce an intermediate value of the three phase voltage command signals;

means for adding a value $V_o$, corresponding to half of the intermediate value, to the three phase instantaneous voltage command signals respectively to produce modulated wave signals $V_u^{}$, $V_v^{}$ and $V_w^{**}$;

means for generating a triangular wave signal $e_c$ at a frequency $f_c$ having a peak value corresponding to ¼ of an input DC voltage $E_d$ to said triangular wave signal $e_c$;

means for generating a second carrier wave $e_{c2}$ by subtracting the signal corresponding to ¼ of said input DC voltage $E_d$ from said triangular wave signal $e_c$;

a first comparator for comparing said modulated wave signals $V_u^{}$, $V_v^{}$ and $V_w^{}$ with said first carrier wave $e_{c1}$ for each phase to form PWM signals for controlling a first unit converter; and a second comparator for comparing said modulated wave signals $V_u^{}$, $V_v^{}$ and $V_w^{}$ with said second carrier wave $e_{c2}$ for each phase to form PWM signals for controlling a second inverter unit.

3. A large capacity variable speed driving system for an AC motor according to claim 22 or 24, wherein the number of winding phases of said AC motor and output phases in said inverter system are 6 or more.

4. A large capacity variable speed driving system for an AC motor according to claim 22 or 24 further comprising vector control means for controlling said AC motor in such a manner that the torque component and magnetic flux component in the primary current of said AC motor are separated.

5. A large capacity variable speed driving system for an AC motor according to claim 22 or 24, further comprising:

a converter system for converting an AC power source into said DC power, which includes unit converters connected in parallel in a multiplex manner; and means for controlling said converter system, wherein said unit converter includes a GTO thyristor with a switching frequency of 500 Hz or more, and said control means comprises a power factor adjusting circuit and a spatial vector type sub-harmonic system PWM control means for controlling the output signal from said power factor adjusting circuit.

6. A large capacity variable speed driving system for an AC motor according to claim 1 or 2, further comprising:

a converter system for converting an AC power source into said DC power, which includes unit converters connected in series in a multiplex manner; and means for controlling said converter system;

wherein said unit converter includes a GTO thyristor with a switching frequency of 500 Hz or more, and said control means comprises a power factor adjusting circuit and a spatial vector type SH system PWM control means for controlling the output signal from said power factor adjusting circuit.

7. A large capacity variable speed driving system for an AC motor according to claim 22 or 24, further comprising a snubber circuit provided with snubber energy recovering means for recovering the loss generated in the snubber to DC power on the inverter input side.

8. A large capacity variable speed driving system for an AC motor according to claim 5, further comprising a snubber circuit provided with snubber energy recovering means for recovering the loss generated in the snubber to DC power on the inverter input side.

9. A large capacity variable speed driving system for an AC motor according to claim 6, further comprising a snubber circuit provided with snubber energy recovering means for recovering the loss generated in the snubber to DC power on the inverter input side.

10. A large capacity variable speed driving system for an AC motor according to claim 7, wherein it is applied to driving a rolling mill system.

11. A large capacity variable speed driving system for an AC according to claim 8, wherein it is applied to driving a rolling mill system.

12. A large capacity variable speed driving system for an AC motor according to claim 9, wherein it is applied to driving a rolling mill system.

13. A large capacity variable speed driving system according to claim 1 or 2, wherein said PWM control device controls the plurality of unit inverters to produce a torque ripple of no more than 1% in the AC motor.

* * * * *